(12) United States Patent
McHenry et al.

(10) Patent No.: US 12,426,132 B2
(45) Date of Patent: Sep. 23, 2025

(54) THERMAL PROCESSING TECHNIQUES FOR METALLIC MATERIALS

(71) Applicant: Carnegie Mellon University, Pittsburgh, PA (US)

(72) Inventors: Michael E. McHenry, Pittsburgh, PA (US); Kevin Byerly, Pittsburgh, PA (US); Paul R. Ohodnicki, Pittsburgh, PA (US); Yuval Krimer, Pittsburgh, PA (US); Satoru Simizu, Pittsburgh, PA (US); Alex M. Leary, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 608 days.

(21) Appl. No.: 16/439,418

(22) Filed: Jun. 12, 2019

(65) Prior Publication Data

US 2020/0029396 A1  Jan. 23, 2020

Related U.S. Application Data

(60) Provisional application No. 62/917,401, filed on Dec. 6, 2018, provisional application No. 62/764,052, filed
(Continued)

(51) Int. Cl.
| | |
|---|---|
| *H05B 6/10* | (2006.01) |
| *C21D 9/56* | (2006.01) |
| *C30B 31/12* | (2006.01) |
| *C30B 31/20* | (2006.01) |
| *H01F 1/153* | (2006.01) |

(Continued)

(52) U.S. Cl.
CPC ............... *H05B 6/06* (2013.01); *C30B 31/12* (2013.01); *C30B 31/20* (2013.01); *H05B 6/04* (2013.01); *H05B 6/105* (2013.01); *H05B 2206/024* (2013.01)

(58) Field of Classification Search
CPC ........................... H05B 6/06; H05B 2206/023
See application file for complete search history.

(56) References Cited

U.S. PATENT DOCUMENTS 3,244,454 A * 4/1966 Valentine ............... B65G 9/002
                                                  406/2
4,061,451 A * 12/1977 Bardet .................. C03B 37/029
                                                  264/479

(Continued)

*Primary Examiner* — Ibrahime A Abraham
*Assistant Examiner* — Lawrence H Samuels
(74) *Attorney, Agent, or Firm* — Fish & Richardson P.C.

(57) ABSTRACT

A method of thermally processing a material with a thermal processing system includes providing a material for treating in an in-line thermal process to a heating system, providing a force to the material at a portion of the material configured to be heated by the heating system, adjusting the heating system to a specified temperature value, and heating the portion of the material to the specified temperature value while the portion of the material is under the force to change a magnetic property in the portion of the material. The heating system is moveable from a first position that is away from a path of the material through the in-line thermal process to a second position in which the heating system is configured to heat the portion of the material to the specified temperature value. The heating system can include induction-based heating.

19 Claims, 20 Drawing Sheets

Related U.S. Application Data on Jul. 16, 2018, provisional application No. 62/763,354, filed on Jun. 12, 2018.

(51) Int. Cl.
*H05B 6/04* (2006.01)
*H05B 6/06* (2006.01)

(56) References Cited

U.S. PATENT DOCUMENTS

| | | | | |
|---|---|---|---|---|
| 4,116,728 A * | 9/1978 | Becker | | C21D 1/04 |
| | | | | 148/108 |
| 4,288,260 A * | 9/1981 | Senno | | C21D 9/56 |
| | | | | 148/100 |
| 4,444,602 A * | 4/1984 | Makino | | H01F 1/15341 |
| | | | | 148/121 |
| 4,482,402 A * | 11/1984 | Taub | | C21D 9/56 |
| | | | | 148/121 |
| 4,596,613 A * | 6/1986 | Lin | | H01F 1/15341 |
| | | | | 148/122 |
| 4,708,325 A * | 11/1987 | Georges | | H05B 6/365 |
| | | | | 219/645 |
| 4,828,227 A * | 5/1989 | Georges | | H05B 6/104 |
| | | | | 219/673 |
| 5,025,124 A * | 6/1991 | Alfredeen | | H05B 6/02 |
| | | | | 219/673 |
| 5,069,428 A * | 12/1991 | Li | | C21D 1/04 |
| | | | | 266/104 |
| 5,260,538 A * | 11/1993 | Clary | | B01J 8/1836 |
| | | | | 219/628 |
| 5,676,767 A * | 10/1997 | Liu | | G08B 13/2488 |
| | | | | 148/108 |
| 5,757,272 A * | 5/1998 | Herzer | | H01F 1/15333 |
| | | | | 148/108 |
| 6,011,475 A * | 1/2000 | Herzer | | G08B 13/2442 |
| | | | | 340/572.6 |
| 6,180,933 B1 * | 1/2001 | Demidovitch | | H05B 6/067 |
| | | | | 219/645 |
| 6,254,695 B1 * | 7/2001 | Herzer | | C21D 1/04 |
| | | | | 148/120 |
| 6,373,036 B2 * | 4/2002 | Suzuki | | H05B 6/145 |
| | | | | 219/662 |
| 7,121,024 B1 * | 10/2006 | Clevenberg | | D06F 71/02 |
| | | | | 38/71 |
| 8,242,420 B2 * | 8/2012 | Fishman | | C30B 11/003 |
| | | | | 219/634 |
| 10,168,392 B2 * | 1/2019 | Leary | | G01R 33/02 |
| 10,337,081 B2 * | 7/2019 | Reed, Jr. | | C21D 9/564 |
| 2003/0197007 A1 * | 10/2003 | Kim | | H01L 21/67109 |
| | | | | 219/635 |
| 2003/0226618 A1 * | 12/2003 | Herzer | | C21D 9/56 |
| | | | | 148/121 |
| 2005/0259712 A1 * | 11/2005 | Lazor | | H05B 6/24 |
| | | | | 373/144 |
| 2010/0199528 A1 * | 8/2010 | Fabrikant | | D06F 71/32 |
| | | | | 38/15 |
| 2010/0265028 A1 * | 10/2010 | McHenry | | H01F 1/15308 |
| | | | | 336/221 |
| 2012/0222337 A1 * | 9/2012 | Grange | | D06F 61/02 |
| | | | | 38/101 |
| 2013/0139929 A1 * | 6/2013 | Francoeur | | C22C 38/02 |
| | | | | 148/111 |
| 2014/0338793 A1 * | 11/2014 | Leary | | G01R 33/02 |
| | | | | 148/108 |
| 2015/0122801 A1 * | 5/2015 | Jones | | B21D 37/16 |
| | | | | 219/602 |
| 2015/0298207 A1 * | 10/2015 | Prest | | H05B 6/42 |
| | | | | 164/513 |
| 2015/0360141 A1 * | 12/2015 | Tomar | | H05B 6/40 |
| | | | | 422/186.04 |
| 2016/0050721 A1 * | 2/2016 | Corda | | H05B 6/1245 |
| | | | | 219/622 |
| 2018/0127851 A1 * | 5/2018 | Reed, Jr. | | C21D 9/5735 |

* cited by examiner

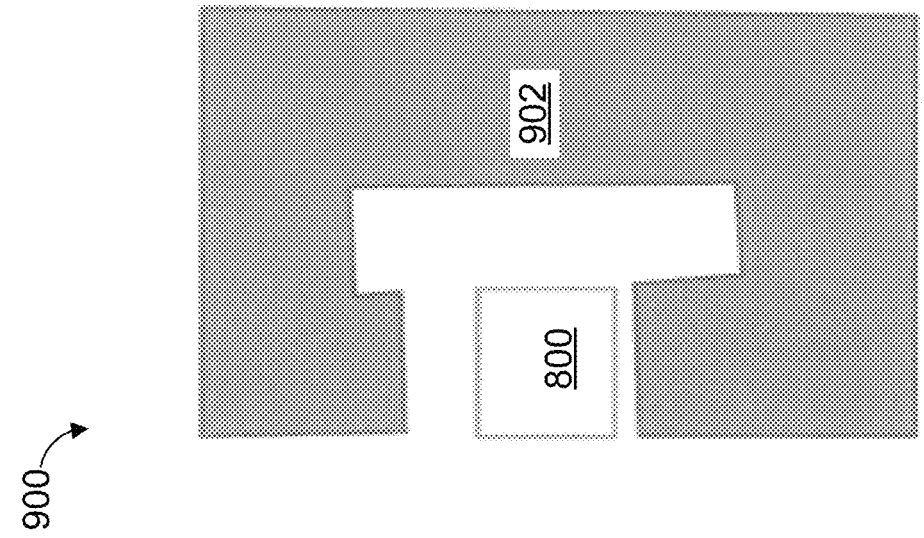
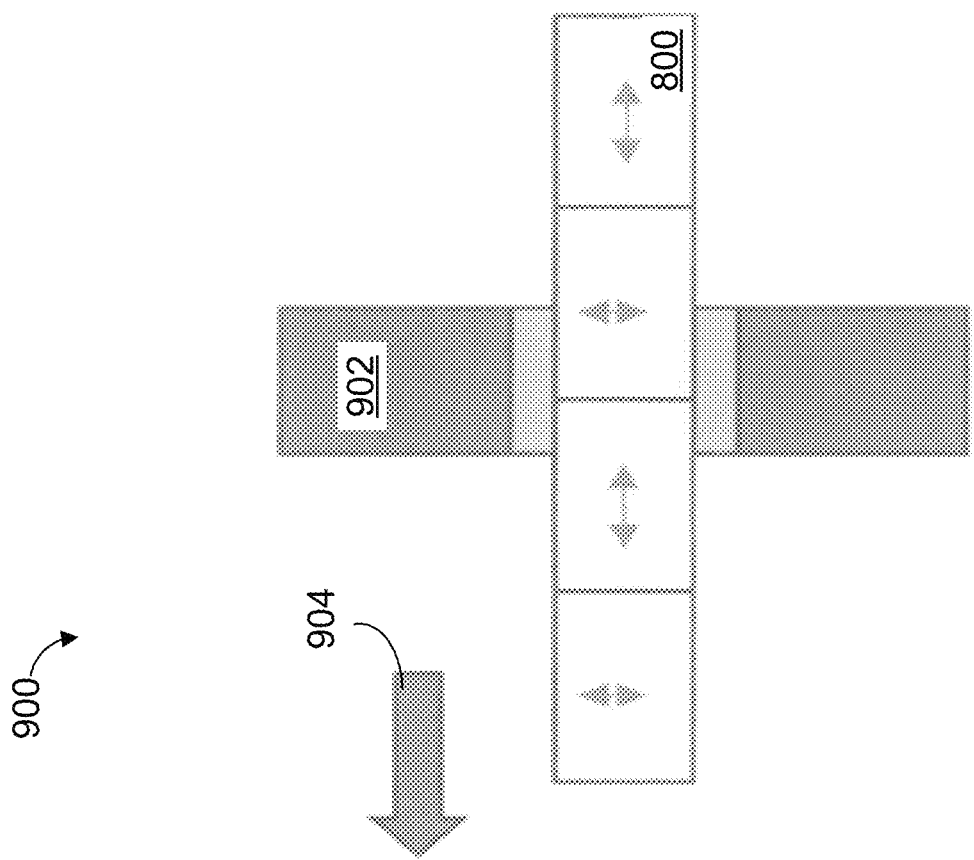
Fig. 9B
Fig. 9A

THERMAL PROCESSING TECHNIQUES FOR METALLIC MATERIALS

CROSS-REFERENCE TO RELATED APPLICATION

This application claims priority under 35 U.S.C. § 119(e) to U.S. Patent Application Ser. No. 62/763,354, filed on Jun. 12, 2018, to U.S. Patent Application Ser. No. 62/764,052, filed on Jul. 16, 2018, and to U.S. Patent Application Ser. No. 62/917,401, filed on Dec. 6, 2018, the entire contents of each of which are hereby incorporated by reference.

GOVERNMENT SUPPORT CLAUSE

This invention was made with government support under grant Department of Energy Award No. DE-EE00031004, and Department of Energy Award No. DE-EE0007867. The government has certain rights in the invention.

FIELD OF TECHNOLOGY

This document relates in-line thermal processing of metallic materials. More specifically, this document relates to annealing of amorphous metal alloy materials for controlling alloy anisotropy. The materials can be used in a wide variety of applications.

BACKGROUND

Nanocrystalline and amorphous nanocomposite alloys are an emerging class of soft magnetic materials for a number of applications spanning power electronics, transformers, rotating electrical machinery, and others. A first step in producing this class of alloys is through rapid solidification processing techniques to form long metallic glass ribbons approximately 10-20 microns in thickness and between a few millimeters and several inches in width. The metallic ribbons can be meters to kilometers in length. Synthesized ribbons are then subjected to optimized annealing treatments to generate a microstructure composed of nanocrystals embedded within an amorphous precursor. For conventional manufacturing processes, the annealing treatment is performed after tape wound cores have been formed due to the brittle mechanical properties of the cores which make handling of the ribbon prohibitively difficult in tape form after the annealing process to optimize properties.

SUMMARY

The present disclosure describes methods and systems relating to thermal processing techniques for metallic materials. These thermal processes can include strain annealing of metallic alloys, including amorphous nanocomposites. The strain annealing process can be used to control the magnetic permeability in the nanocomposite material. The permeability can be adjusted by applying varying temperatures and stresses or strains during the annealing process of the amorphous material. In some implementations, a wire, ribbon, or other geometry of metal can be fed through an in-line process to strain anneal the material as it passes through a heat source. For in-line manufacturing processes, the material can be kept monolithic, meaning that the material can be a single, continuous ribbon, wire, etc. The material can be free of seams or imperfections from breaks or cuts that are introduced for different annealing processes, which require that each section be reattached to reform the pieces into a single ribbon. The material can be de-spooled, annealed, and re-spooled. The material can have different magnetic permeability values in different regions, if desired, while the different regions form a continuous ribbon, wire, etc.

Because in-line thermal processing processes result in a monolithic material with regions having varying properties, these in-line thermal processing processes can be valuable in terms of additional flexibility of alloy and material property optimization. The in-line induction heating methods described for amorphous metal ribbons can provide rapid thermal processing of amorphous metal ribbons for enhanced and precise control of thermal annealing profiles.

This document describes a heat system (e.g., a furnace) for in-line thermal processing of metallic materials. The heat system is configured to heat the metallic material with a heating device. The heating device can include two heat sources that are positioned on opposite sides of the material. For example, the heat sources can be positioned proximate a top surface and proximate a bottom surface of the material (e.g., on two opposing sides of the material), respectively. Heating the material with two heat sources improves the uniformity of the thermal processing of the material relative to heating systems having a single heat source. In some implementations, the heat sources are each configured to contact or nearly contact (e.g., with an air-gap of a few micrometers or millimeters) the material as the material is fed through the heat system for the in-line thermal processing. The contact or near-contact of the heat sources on opposite sides of the material further improves a uniformity of the heating of the material during the thermal process and thus improves a precision of adjusting the magnetic permeability of the material. Precise control of the magnetic permeability of the material improves the performance of devices that use the material, such as axial flux switched reluctance motors, subsequently described in detail.

Particular implementations of the subject matter described in this disclosure may be implemented to realize one or more of the following potential advantages. In some implementations, the heat system described herein is configured to be removable/retractable from the material as the material is processed. This is beneficial because the heat system can be pre-heated for temperature adjustment without the material (e.g., the ribbon) present in the heat system. More specifically, the heat system can be set to (e.g., calibrated to) a precise set point temperature for producing the desired effect on the material (e.g., tuning to a particular magnetic permeability). Once the heat source is at the set point temperature, the material can be loaded by utilizing a combined split-hinge mechanism with retractable rail feature. If an anomaly occurs, such as a material breakage, the heat sources of the heat system can be moved out of the material line of sight and, at the same time, remain at the calibrated set point temperature while the material (e.g., a feedstock ribbon) is re-loaded from an unwind station to a rewind station (which may require keeping the material at a particular, calibrated tension). The heat system configuration allows for a more efficient use of time and resources as compared to a fixed-plate furnace.

In some implementations, the heat sources of the heat system can include induction heat sources configured for processing various kinds of materials (e.g., work pieces) through induction heating. Induction heating includes a non-contact process for electromagnetically heating electrically conductive materials such as metals.

The induction heating methods described in this disclosure save energy relative to conventional, convection heating by reducing heat loss and increasing heating efficiency. Energy is saved by directly transferring heat to the part being heated or to the susceptor in direct thermal contact with the part to be heated. Induction-based methods result in significant efficiency of the power delivered to the desired material versus the heat transferred to other parts and environment for a variety of other heating methods. Improved control over the heating process is also possible in this case including (1) the characteristic length-scale of the heated zone and (2) the heating rate of the part being heated. Because induction heating does not necessarily require a large heated thermal mass to regulate temperature of the part, it can also offer the opportunity for more rapid variations in thermal profiles and heating spatially along a part processing through the process through in-line methods.

The heat system and the heating configurations described in this disclosure can be useful for varying applications. Specifically, described herein is an axial flux switched reluctance motor. The heat system uses alternating isotropic and anisotropic regions in the same material to create a multiple pole rotor with a built-in flux path. Other devices utilizing the alternating isotropic and anisotropic regions and varying magnetic permeabilities of the monolithic work material can also be realized.

In an aspect, a process for thermally processing a material with a thermal processing system can include providing a material for treating in an in-line thermal process to a heating system; providing a tension force to the material at a portion of the material configured to be heated by the heating system; adjusting the heating system to a specified temperature value; moving the heating system from a first position that is away from a path of the material through the in-line thermal process to a second position in which the heating system is configured to heat the portion of the material to the specified temperature value; and heating the portion of the material to the specified temperature value while the portion of the material is under the tension force to change a magnetic property in the portion of the material.

In some implementations, heating the portion of the material includes contacting a first side of the portion of the material with a first heat source and contacting a second side of the portion of the material with a second heat source, the second side being opposite the first side.

In some implementations, the heating system comprises a hinge coupling the first heat source to the second heat source, and where moving the heating system from the first position to the second position comprises moving the hinge from an open position to a closed position to cause the heating system to close over the portion of the material, where the closed position causes the first heat source to contact or nearly contact the first side of the portion of the material and the second heat source to contact or nearly contact the second side of the portion of the material.

In some implementations, the first heat source and the second heat source are configured to be within one centimeter of each other during the heating. In some implementations, moving the heating system from the first position to the second position comprises moving the heating system along a track that is approximately orthogonal to the in-line thermal process. In some implementations, providing the material comprises producing an amorphous precursor to the material, the material including a metal, to form an amorphous metal material having less than 20% crystallization by volume; feeding the amorphous metal material into the heating system; performing, by the heating system, devitrification of the amorphous precursor, where the devitrification comprises a process of crystallization; forming, based on the devitrification, the nanocomposite with nano-crystals that comprises an induced magnetic anisotropy. In some implementations, providing the material to the heating system for the in-line thermal process comprises de-spooling the material under tension through the heating system and re-spooling the material after the material has passed through the heating system.

In some implementations, the method further comprises tuning, based on one or more of composition, temperature, configuration, and magnitude of stress applied to the portion of the material, a magnetic anisotropy of the material; and adjusting, based on the magnetic anisotropy, a magnetic permeability of the material.

In some implementations, the method further comprises: retracting the heating system away from the portion of the material during turning of the temperature, configuration, or magnitude of stress applied to the portion of the of the material; and moving the heating system to reengage the portion of the material in response to completion of the tuning.

In some implementations, the heating system is configured to process the material in a ribbon configuration, the ribbon configuration having a width of approximately between 0.5 inches and 4 inches and a thickness of approximately 0.0007" to 0.001".

In some implementations, the process includes providing the material to the heating system at a rate of at least 10 feet per minute. In some implementations, treating the portion of the material to the specified temperature value comprises: providing an induction coil in the heating system; and providing an alternating current to the induction coil to cause the induction coil to generate an electromagnetic (EM) field configured to cause the portion of the material to be at the specified temperature value.

In some implementations, the process includes providing a susceptor device in thermal communication with the induction coil and causing, by the EM field, the susceptor device to be at the specified temperature value; and contacting the portion of the material with the susceptor device.

In some implementations, heating sources of the heat system are shaped to correspond to a cross-sectional shape of the material. In some implementations, heating sources of the heat system comprise at least one of a silicon carbide layer a graphite layer, a ceramic layer, and a metal layer. In some implementations, the portion of the material comprises a first segment of the material, and where the method further comprises providing a different tension value to a second segment of the material that is adjacent to the first segment to cause a different magnetic anisotropy in the second segment of the material.

In an aspect, a process for thermally processing a material with a thermal processing system includes providing a material for treating in an in-line thermal process to a heating system including an induction coil; providing a tension force to the material at a portion of the material configured to be heated by the heating system; providing an alternating current to the induction coil to cause the induction coil to generate an electromagnetic (EM) field; and causing, by the EM field, heating of the portion of the material to a specified temperature value while the portion of the material is under the tension force to change a magnetic property of the material.

In some implementations, the heating system comprises a susceptor device, and where causing, by the EM field, the heating of the portion of the material to the specified temperature value comprises contacting the susceptor device to the portion of the material; and heating the susceptor device to the specified temperature value by the EM field, where the susceptor device is configured to heat the portion of the material to the specified temperature value.

In some implementations, the heating system comprises the induction coil, an insulating layer adjacent to the induction coil, a graphite block adjacent to the insulating layer, and a heat transfer plate adjacent to the graphite block, where the heat transfer plate is configured to contact the portion of the material. In some implementations, the heating system comprises the induction coil, an insulating layer adjacent to the induction coil, a graphite plate adjacent to the insulating layer, a silicon carbide plate adjacent to the graphite plate, and a heat transfer plate adjacent to the silicon carbide plate, where the heat transfer plate is configured to contact the portion of the material.

In some implementations, the material comprises a metal ribbon that is approximately 1 inch to 2 inches wide and approximately 0.0007" to 0.001" thick.

In some implementations, causing, by the EM field, heating of the portion of the material to a specified temperature value comprises causing the portion of the material to be heated by the EM field directly; and causing the portion of the material to be heated by a susceptor device that is also heated by the EM field, the susceptor device being in thermal communication with the portion of the material.

In some implementations, the process includes providing the material to the heating system at a rate of at least ten feet of material per minute. Generally, heating sources of the heat system are shaped to correspond to a cross-sectional shape of the material.

In some implementations, the material comprises an amorphous metal material, and where providing the amorphous metal material comprises: producing an amorphous precursor to the material, the material including a metal, to form an amorphous metal material having less than 20% crystallization by volume; feeding the amorphous metal material into the heating system; performing, by the heating system, devitrification of the amorphous precursor, where the devitrification comprises a process of crystallization; forming, based on the devitrification, the nanocomposite with nano-crystals that comprises an induced magnetic anisotropy.

In some implementations, the portion of the material comprises a first segment of the material, and where the method further comprises providing a different tension value to a second segment of the material that is adjacent to the first segment to cause a different magnetic property in the second segment of the material.

In some implementations, a method for thermally processing a material with a thermal processing system for forming a rotor of a linear motion device includes providing an amorphous metal material for treating in an in-line thermal process to a heating system; providing a first tension force to the material at a portion of the amorphous metal material configured to be heated by the heating system; adjusting the heating system to a first temperature value for a first segment of the amorphous metal material; strain annealing the first segment of the amorphous metal material using the first temperature value and the first tension force; providing a second tension force to a second segment of the amorphous metal material; and strain annealing the second segment of the amorphous metal material using the second tension force.

In some implementations, the process includes adjusting the heating system to a second temperature value different than the first temperature value for the second segment of the amorphous metal material; and strain annealing the second segment of the amorphous metal material using the second temperature value.

In some implementations, the first segment of the amorphous metal material is adjacent to the second segment of the amorphous metal material. In some implementations, the first temperature value is different than the second temperature value. In some implementations, the first tension force is different than the second tension force.

In some implementations, the strain annealing the first segment causes a first magnetic anisotropy in the first segment having a first permeability value, and where strain annealing the second segment causes a second magnetic anisotropy in the second segment having a second permeability value. In some implementations, the first magnetic anisotropy is in a first direction that is approximately orthogonal to a second direction of the second magnetic anisotropy. In some implementations, the first permeability value is at least ten times larger than the second permeability value. In some implementations, each of the first segment and the second segment are approximately 0.5 inches to 4 inches in width, approximately 0.5 inches to 4 inches in length, and approximately between 0.0007" and 0.001" thick.

Generally, adjusting the heating system to a second temperature value for a second segment of the amorphous metal material comprises moving the heating system from away from a path of the amorphous metal material, changing a temperature value of the heating system to the second temperature value from the first temperature value, and moving the heating system back to the path of the amorphous metal material. In some implementations, the amorphous metal material is monolithic after strain annealing each of the first segment and the second segment. In some implementations, strain annealing the amorphous metal material comprises conduction-based heating. In some implementations, strain annealing the amorphous metal material comprises induction-based heating.

Details of one or more implementations are set forth in the accompanying drawings and the description below. Other features, objects, and advantages will be apparent from the description, the drawings, and the claims.

BRIEF DESCRIPTION OF THE FIGURES

FIGS. 9A-9B show examples of a linear motion device from a front view (FIG. 9A) and a side view (FIG. 9B).

DETAILED DESCRIPTION

Figure 1A:
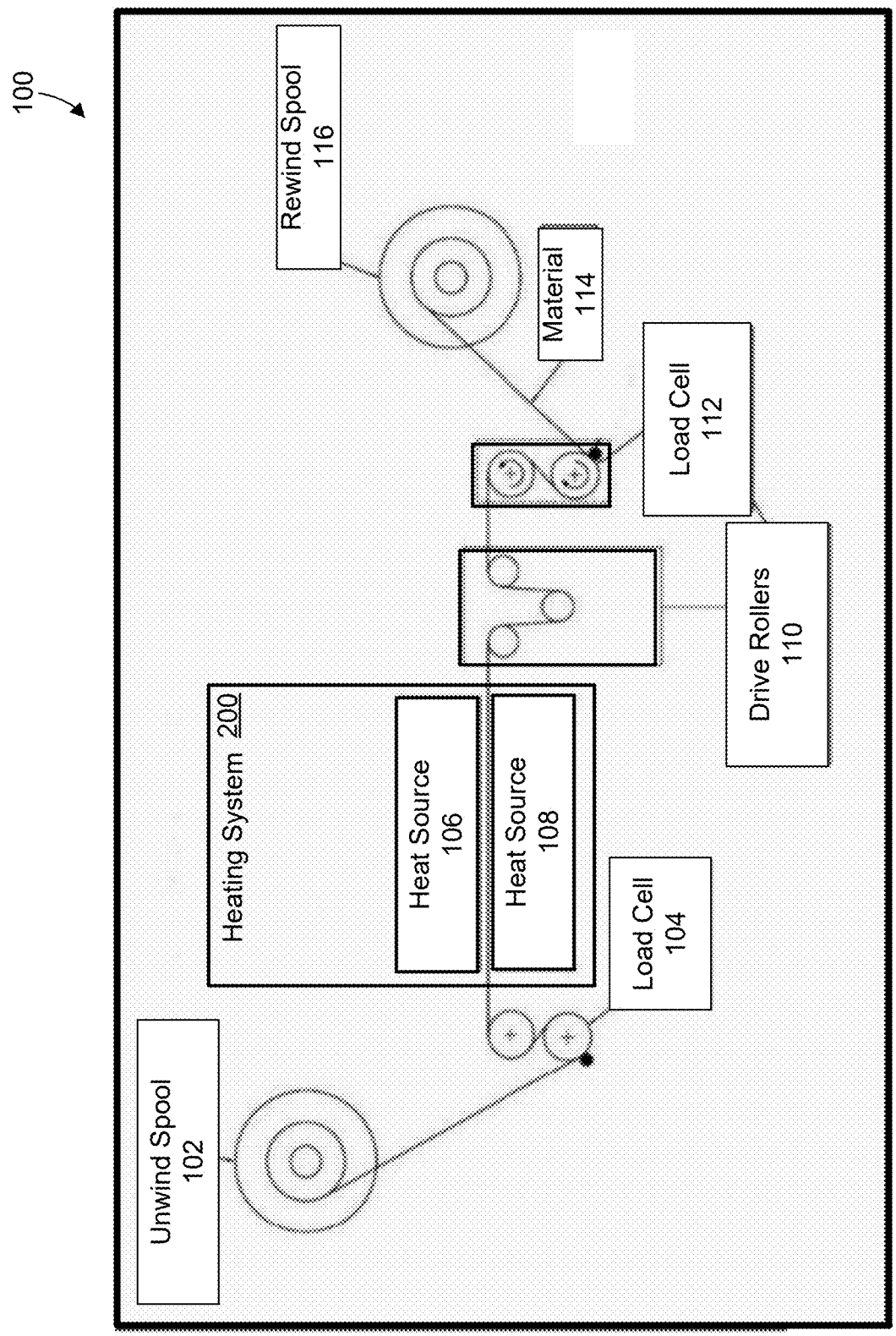
FIGS. 1A-1B each show a block diagram of an example in-line thermal processing system including a heating system for processing metallic materials.

Turning to FIG. 1A, a thermal processing system 100 is configured for in-line thermal processing of metallic materials. The thermal processing system 100 can include a heating system 200. The heating system 200 is configured to heat a material 114 (e.g., a metallic ribbon) with a heat source. The thermal processing system 100 is configured to process the material 114 to induce a local magnetic property in the material as the material is fed through the thermal processing system. Generally, the local magnetic property includes an induced magnetic anisotropy. The thermal processing system 100 is configured to cause changes in magnetic permeability values of the material 114 for different regions of the material. The material 114, having particular magnetic properties after thermal processing (as further described below), can be used in various applications, such as for magnetic motors, fuel cells, electrical grids, combustion technology, and numerous other applications.

The heating system 200 described herein is configured to be removable/retractable from the material 114 as the material is thermally processed by the thermal processing system 100. This is beneficial because the heating system 200 can be pre-heated for temperature adjustment without the material (e.g., the ribbon) present in the heat system. Once the desired temperature is reached by the heating system 200, the heating system can be moved into the in-line processing space of the thermal processing system to thermally process the material 114. This facilitates the in-line thermal processing process. For example, if a manufacturing anomaly occurs (e.g., a ribbon breakage), the temperature of the heating system 200 can be maintained while the heating system is moved out of the way for ribbon adjustment or repair.

The material 114 can be kept monolithic, meaning that the material can be a single, continuous ribbon, wire, or other geometry. The material 114 is free of seams or imperfections from breaks or cuts that are introduced for alternative annealing processes, which can require that each section of the material (having been stress annealed under different heating values and stress values) be reattached to reform the pieces into a single piece. Rather, for the system 100, the material 114 can be de-spooled, annealed, and re-spooled continuously. The material 114 can include different magnetic permeability values in different regions, if desired, such as along the axis of the material as the material is fed through the thermal processing system 100.

The heat sources 106, 108 of the heat system can include induction heat sources configured for processing various kinds of materials (e.g., work pieces) through induction heating. Induction heating includes a non-contact process for electromagnetically heating electrically conductive materials such as metals. Generally, heat is generated in the material 114 by generating a rapidly fluctuating electromagnetic field, created by running a high-frequency alternating current through a conductive coil (induction coil) specially designed for the application. The electromagnetic field penetrates the material 114, generating oscillating electric currents internal to the material which heat the object. For induction heating, the heat is generated inside the material 114 itself, instead of heat being radiated by the external heat sources 106, 108. In some implementations, the induction-based heat source can include a susceptor device for susceptor annealing of materials. Generally, the susceptor device includes a material configured to absorb electromagnetic energy and convert it to heat (which is sometimes designed to be re-emitted as infrared thermal radiation). In the case of susceptor-based induction anneals, the material 114 may be predominantly heated through direct thermal contact with the heat sources 106, 108, which are configured to be heated internally through the applied electromagnetic field excitation. Generally, the susceptors can include metallized film, ceramics or metals (such as aluminum flakes) in a configuration to evenly heat the work piece material (e.g., disposed on opposing sides of the material, as previously described). Induction-based thermal processes are described in further detail, below.

Although the techniques described in the present disclosure are applicable to a wide range of geometries and materials for the heating devices, various implementations will be described below in the context of two heat sources 106, 108 for applying heat on an upper surface (e.g., a top surface) of the material 114 and on a lower surface (e.g., a bottom surface) of the material opposite the upper surface. Generally, the material 114 is described as a ribbon geometry. However, other geometries of materials are possible, including (but not limited to) wires, foil sheets, and so forth. Additionally, the processes described herein are generally described in the context of the heat sources 106, 108 having a generally planar geometry, which can be used for stress annealing the material when the material is in a ribbon geometry. However, the heat sources 106, 108 can be milled or shaped into any geometry that is desirable for evenly heating the material. For example, the heat sources 106, 108 can be flat to evenly contact and heat the material as a ribbon, or curved to evenly contact and heat the material as a wire. The surfaces of the respective heat sources 106, 108 can be irregular, regular, curved, flat, or any such geometry as desired.

The material 114 generally includes a metallic material having magnetic properties, such as the ability to include magnetic anisotropy. While examples of amorphous nanocomposites are used as the example material for the various thermal processes and thermal processing systems described herein, the material can include a wide variety of metallic materials such as metallic alloys.

Examples of the material 114 are now described. The material 114 can include a nanocomposite soft magnetic materials. The material 114 can include crystalline grains smaller than 100 nm embedded within an amorphous matrix. Extensive research into this class of materials resulted in their use in a wide range of soft magnetic applications. The extended set of processing dimensions in nanocomposites, such as grain size, phase identity, crystal orientation and volume fraction, present opportunities to tailor properties. Several classes of nanocomposite alloys exist. Compositions typically consist of compositions (TL-TE-M) involving combinations of late transition metals (TL), early transition metals (TE), and metalloids (M). Some compositions also require small additions of noble metals such as Cu to promote finer grain structures. The Curie temperature of the amorphous phase in iron (Fe) rich nanocomposite alloys is typically below 400° C. and soft magnetic properties degrade approaching and above this temperature. Cobalt additions can increase the amorphous phase Curie temperature, as described in U.S. Patent Publication No. 2010/0265028, incorporated herein in entirety by reference, and extend useful range of operating temperatures.

The introduction of a uniaxial magnetic anisotropy in nanocomposite soft magnetic materials is a well-known technique to control permeability. Magnetic permeability ($\mu$) is the change in induction (B) with an applied field (H) and is equal to the slope of a magnetization curve. Both high and low permeabilities may be advantageous depending on the application and it is often desirable to tune permeability to a specific value. In particular, flat loop magnetization with linear response of the magnetization with applied field, to a field designated as the anisotropy field, $H_K$, where the magnetization reaches it saturation value, $M_s$, are desirable for many applications. In flat loop materials the permeability at a fixed temperature remains approximately single valued up to the saturating field, $H_K$, and given by:

$$\mu = M_s / H_k$$

For low permeability materials in toroidal cores that show linear magnetization responses, the anisotropy energy density $K_u$ is:

$$K_u = \frac{M_s H_k}{2} = \frac{B_s^2}{2\mu}.$$

Bs is the saturation induction and the permeability $\mu$ is inversely proportional to the energy density for wound cores with transverse induced anisotropy.

The manufacturing process to make nanocomposites of this type typically include an annealing step where one or more crystalline phases is nucleated and grown within an amorphous precursor material. Several processing methods are available during annealing to develop magnetic anisotropies including the introduction of a magnetic and/or stress field. The use of an amorphous precursor limits the geometry of nanocomposite soft magnets to a critical cooling dimension and these materials often take the shape of cast ribbons resulting from a melt spinning technique or wires drawn from a melt. These ribbons may be tape wound or stamped and stacked into cores for use. Stresses in the final component include residual stresses formed during the casting process, those induced during the annealing, as well as any further processing step such as winding, impregnating, and cutting. Successful devices require adequate control over all processing steps to include or reduce stresses where desired for a specific application.

The induced magnetic anisotropy and demagnetization field, $H_d$, created by the core shape influences the domain pattern in the core. Free magnetic poles on the surface create the demagnetization field, which tend to bend field lines in the material. Toroidal shapes minimize demagnetization effects for materials with domains oriented along the circumference. The direction of the induced anisotropy and the demagnetization field of the core shape determine the primary domain orientation. Annealing materials with negative and positive magnetostriction ($\lambda$) in the crystalline phase under tension can result in transverse and longitudinal domain patterns depending on annealing conditions. Dynamic magnetization processes are complicated but transverse domains in wound core material tend to change magnetization by rotation whereas longitudinal domains change magnetization by domain wall motion. In the case of Fe—Si nanocomposites, the sign of the magnetostriction in the crystalline phase controls the direction of the induced easy axis within a plane oriented based on the primary stress direction. The direction of the magnetic easy axis determines permeability of the core.

Properties in nanocomposites may differ from as-cast or mostly amorphous materials of similar compositions. Magnetostriction is primarily determined by composition and structure of the material, temperature, and stress. The crystalline phase composition often differs from the residual amorphous phase composition and apparent magnetostriction values are composed of contributions from each phase. Crystalline phases also offer additional processing variables such as ordering of atoms/defects, preferred orientations, and the volume fraction of crystals that are useful in the development of anisotropies. In strain annealed Fe-rich nanocomposite cores, the resulting permeability shows an inverse relationship to the magnitude of the stress field applied during annealing.

Nanocomposite ribbons can be subsequently crushed into flake and then consolidated by compaction techniques. The uniaxial anisotropy can be exploited to align the flakes in an applied field prior to compaction. This alloys for retaining anisotropy in shapes possible through consolidation. Further descriptions of nanocomposites that can be formed through stress annealing are described in U.S. Pat. No. 10,168,392, issued Jan. 1, 2019, and incorporated herein in entirety by reference.

For conventional manufacturing processes, the annealing treatment is typically performed after tape wound cores have been formed to avoid processing difficulties stemming from the cores' brittle mechanical properties. Many nanocrystalline and amorphous alloys can become brittle during annealing treatments, which can make subsequent handling and further processing difficult. Furthermore, conventional annealing treatments with traditional furnaces require extensive time to anneal the amorphous alloy. The annealing process using a traditional furnace can take over 10 hours to complete, which is due to the careful and controlled heating rate to the desired set point. If too rapid of a heating rate is used, then this can lead to a potential runaway crystallization reaction making it difficult to attain desired material properties in a reproducible manner, particularly at a manufacturing level. The systems and methods described herein can heat such materials at more controlled heating rates by employing tailored in-line annealing processes, allowing for more precise control of crystallization of the material and simultaneously mitigating the risk of a runaway crystallization reaction resulting in a material with undesirable properties and microstructure.

As such, in-line annealing processes are valuable in terms of material property optimization and enhanced control of magnetic properties throughout the resulting tape wound core by time variation of mechanical, magnetic, or other applied fields impacting ultimate material performance. Advanced in-line annealing processes require extremely rapid heating of the material with careful control of time and temperature. Typical in-line annealing treatments require heating the material from room temperature to the annealing temperature (i.e. 560° C.) in approximately 3-10 seconds. In contrast to conventional annealing treatments, in-line processes described herein can take less than 3 hours to process an equivalent full-scale fabricated core. The processes described herein can also be more energy efficient than traditional annealing processes. For example, the processes described herein avoid producing waste heat (typically associated with producing elevated temperatures in large furnaces) for full-scale fabricated cores.

The thermal processing system 100 is configured for thermal annealing of the material 114 by the heat system 200 using conduction (e.g., heat through contact). The thermal annealing integrated with in-line strain annealing of amorphous and nanocrystalline metallic alloy ribbon by using one or more of (1) embedded resistive wire ceramic heater plates and (2) induction heating of a susceptor as the heat sources. In each example, the architecture of the thermal processing system 100 can include various embodiments. The system 100 depicted in FIG. 1A is a particular example of the thermal processing system.

The thermal heating system 100 includes the heating system 200, which includes at least one heat source. In this example, the heating system 200 includes two heat sources 106, 108, which are configured to be disposed on either side of the material 114 during thermal processing.

The system 100 includes an unwind spool 102 from which the material 114 is sourced, and a rewind spool 116 to which the treated material 114 is wound. The material 114 can include the amorphous nanocomposites described above, in addition to other metal alloys. The material 114 extends from the unwind spool 102 to the rewind spool 116. The material 114 is handled by load cells 104, 112, which can route the material 114 through the heating system 200. Driver rollers 110 cause the material 114 to move through the system 100 at a desired rate so that the annealing process heats the material 114 as desired.

Generally, the material 114 is kept in tension from load cell 104 to load cell 112 though the heating system 200. The tension value can be adjusted as desired. For example, the tension value of the material 114 as it is moved through the heating system 200 can be kept constant or can be changed over time. The value of the tension applied to the material 114 is adjusted by the system 100 to tune the value of the magnetic anisotropy of the material 114 at a particular region in the material (e.g., the region of the material inside the heating system 200). For example, the value of the magnetic permeability can be tuned by adjusting the tension on the material 114 as the material is heat annealed.

Generally, the width of the ribbon used in the process ranges from 0.5 to 4 inches, and the thermal annealing stage ranges from 1 inch to 10 inches in length (along the ribbon axis) with a typical material speed of 5-15 feet per minute. However, the speed can be greater than or less than this typical range. In some implementations, the region of the material 114 that is annealed can be 0.5 inches long before the annealing values for strain and heat are changed. This enables the regions of the material 114 to have varying anisotropies above a threshold change (e.g., a changed anisotropy direction, or double or tripling the magnetic permeability value). The regions can be as short as less than 1 inch and approaching approximately 1 centimeter (cm) in length. This size can be changed depending on the geometry of the heat sources 106, 108. For conduction based thermal annealing, the size of the region can be more precisely defined than for convection-based annealing systems. Furthermore, using induction heating can further refine the size of the regions of the material 114 to increased resolution below the 1 cm range. If the values of the heat and strain are kept static, the region can be increased to be the length of the ribbon.

Figure 1B:
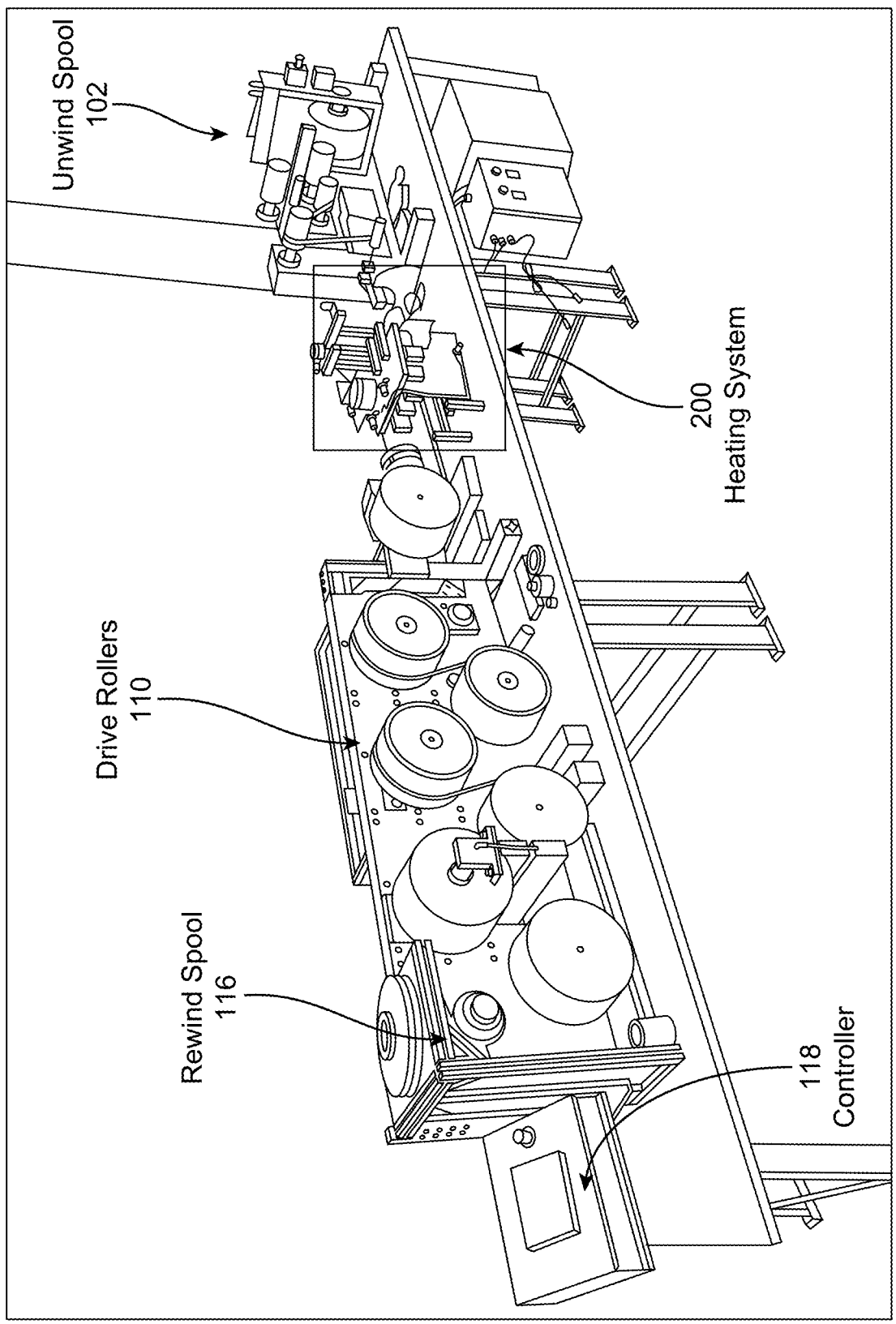

Turning to FIG. 1B, an example implementation of the thermal processing system 100 is shown in accordance with the block diagram of FIG. 1A. To control the temperature, strain, feed speed, and other parameters of the thermal annealing process, the system 100 can include a controller 118. The controller can include a computing device (e.g., a computer processor) configured to execute instructions for causing the thermal process to occur with the system 100 in accordance with desired parameter values (e.g., of strain, temperature, feed speed, induction coil power and frequency and so forth).

Figure 2A:
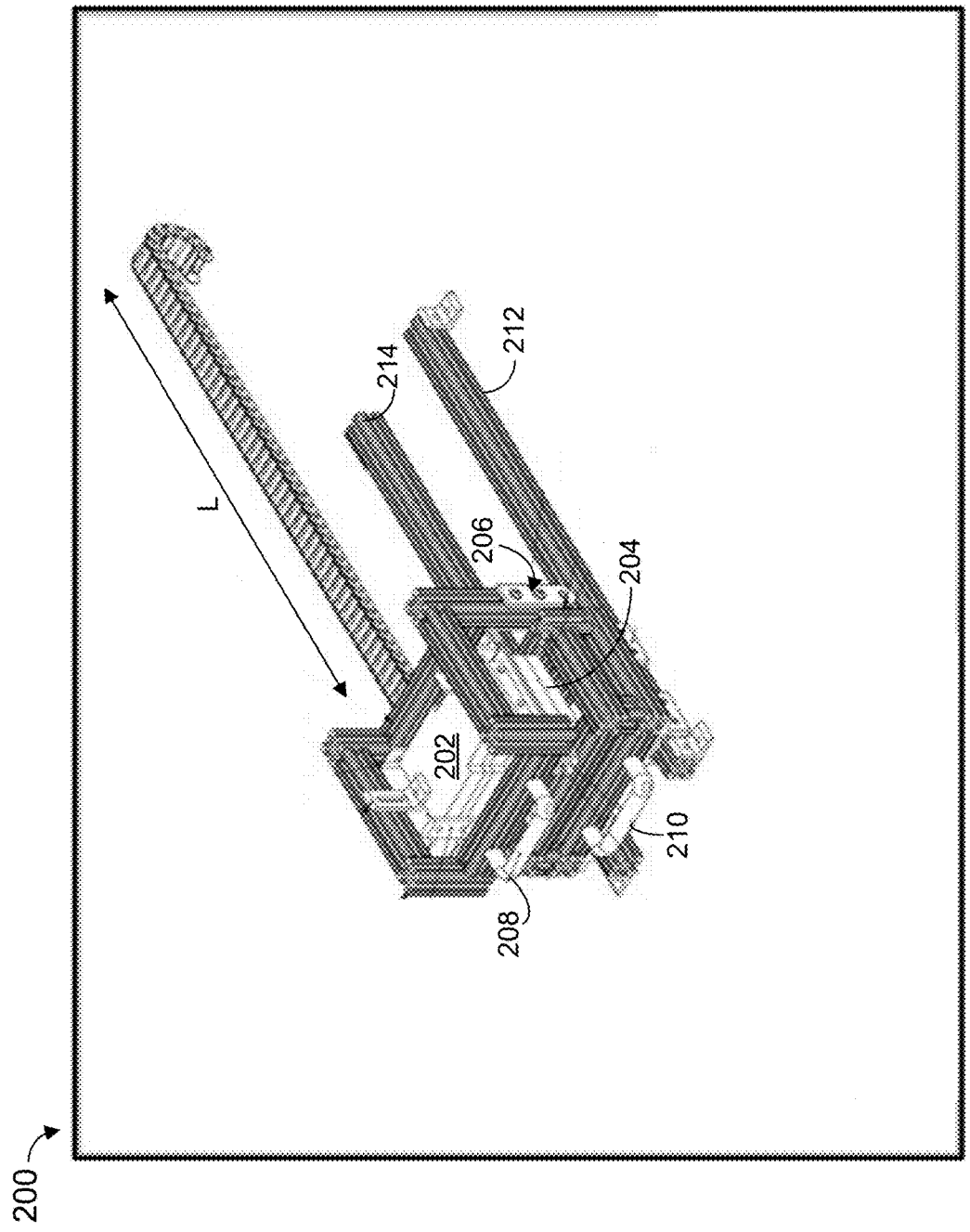
FIG. 2A shows a perspective view of an example heating system for the processing system of FIGS. 1A-1B.

Turning to FIGS. 2A-2D, representations of the heating system 200 are shown. FIG. 2A shows a perspective view of an example heating system for the processing system 100 of FIGS. 1A-1B. The heating system 200 shown in FIG. 2A includes heat sources which are formed from heater plates 202, 204. The plates 202, 204 can include ceramic places. The material 114 is configured to move between the plates 202, 204 and contact the plates. In some implementations, the material 114 is configured to nearly contact (e.g., within a few micrometers up to a few millimeters) the plates 202, 204. As previously stated, the geometries of the plates 202, 204 can be as desired for the particular application. For example, the plates can be flat for processing a ribbon material, and curved for processing a wire material. Other shapes can be milled or formed for the plates 202, 204.

In an aspect, the heating system 200 can include a split-hinge retractable furnace frame using two embedded resistive wire ceramic heater plates, which are the heat source for the upper and lower heater assembly. The split-hinge retractable furnace frame, including members 212 and 214, can be formed from any material. In one example, the frame is formed from extruded aluminum framing (e.g., 8020 aluminum channel) with an integrated hinge mechanism 206 and linear bearings for moving up along members 212 and 214. This allows the plates 202, 204 to move over the ribbon path and away from the ribbon path as needed without requiring adjustment of the ribbon itself. For example, the heater plates can be moved along axis L.

Additionally, the plates can be opened or clamped closed using a hinge 206. For example, the top plate 202 can be moved away from the ribbon by rotating it using the hinge 206 before moving the entire assembly along axis L away from the ribbon. This can ensure that the ribbon is not moved and is kept in tension in the thermal processing device. For example, the plates can be calibrated or heated to the precise temperature desired without affecting the ribbon. When the plates 202, 204 and the ribbon are ready, the plates 202, 204 can be moved back over and under the ribbon, respectively, to sandwich the ribbon between the plates for conductive annealing. Respective handles 208, 210 can be attached to each of plates 202, 204 (or to assemblies holding the plates) to allow a user to open the plates and close the plates as desired. The handles 208, 210 can be insulated to allow a user to manipulate the plates 202, 204 while the plates are still hot. In some implementations, the control system 118 of FIG. 1B can be configured to operate the placement of the plates 202, 204 with respect to the ribbon automatically.

Figure 2B:
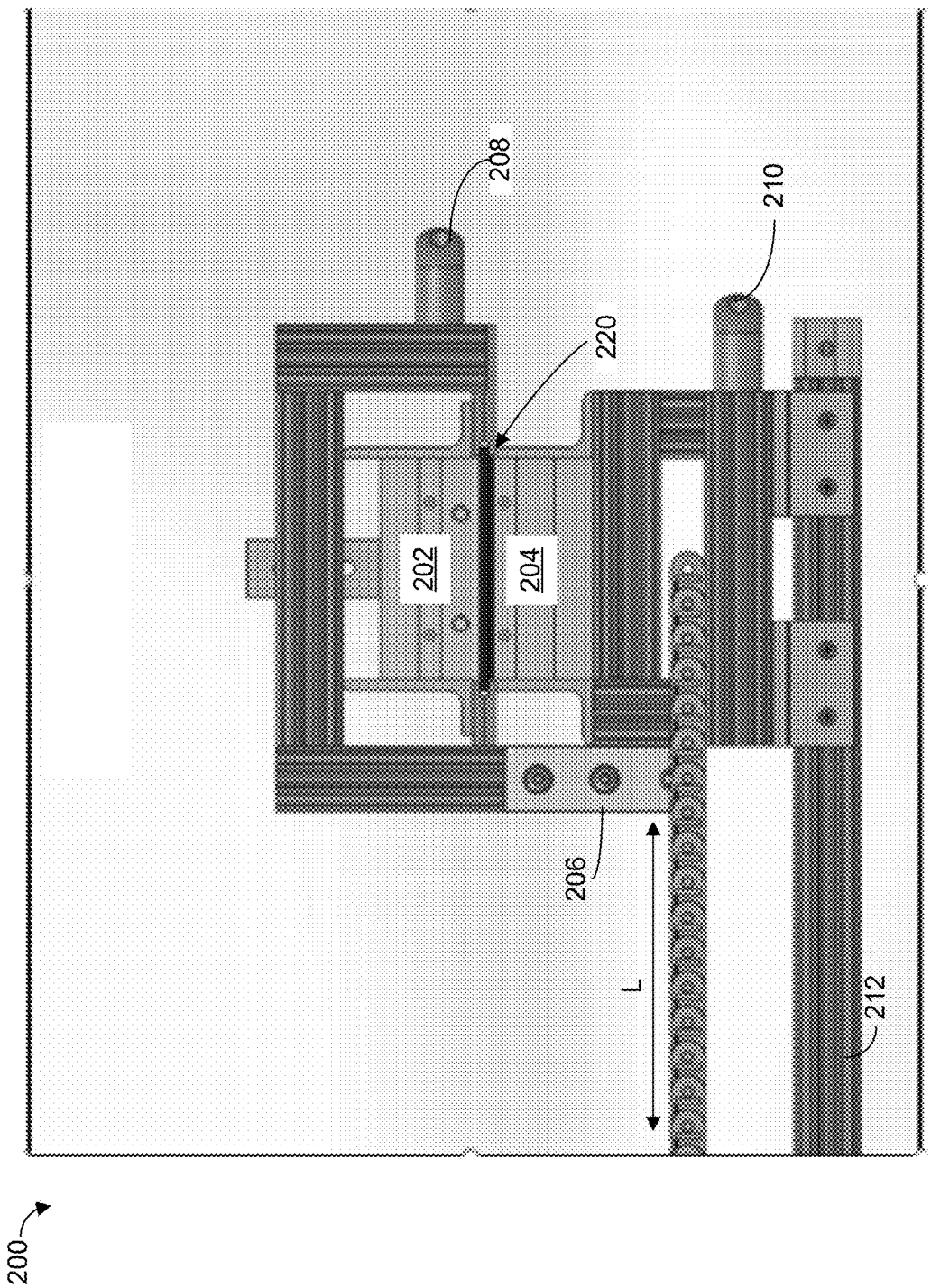
FIG. 2B shows a side view of an example heating system for the processing system of FIGS. 1A-1B.

FIG. 2B shows a side view of an example heating system 200 for the processing system 100 of FIGS. 1A-1B. The side view of each heater plate assembly 202 and 204 can be seen with corresponding models of the upper and lower heater plate configuration. This is achieved through the clamping of the bottommost furnace component in the upper plate assembly. Each heater plate assembly is aligned to one another such that the gap between them is minimized. For example, the gap 220 between the plates 202, 204 can be between three and four millimeters along the entire surfaces of the plates. Such a uniform distance between the plates can enable the heating system 200 to achieve a uniformly high heat transfer during annealing while avoiding additional force (e.g., tension) exerted on the ribbon material 114. Thus, the heating system 200 includes an upper heater assembly 202 that features a height-adjustable, hinged mechanism to allow for the top half of the furnace to be opened for in-line loading of the ribbon and closed for annealing. The heating system 200 includes slide rails 212, 214 so the entire annealing furnace can be moved away from the ribbon path. As previously stated, such movement is beneficial because it allows for furnace pre-heating or temperature adjustment without the ribbon present. When the furnace is at the desired annealing set-point temperature, the ribbon can be loaded by utilizing the combined split-hinge mechanism with retractable rail feature. In the event there is a ribbon breakage, the heating assemblies 202, 204 may be moved out of the ribbon line of sight and, at the same time, allowed to stay at the set point temperature while the feedstock ribbon is re-loaded from unwind station to rewind station. Note that while the heating assemblies 202, 204 are also referred to as heating plates, the heating assemblies generally include the plates themselves in addition to other materials as described in relation to FIGS. 2C-2D. These features allow for a more efficient use of time and resources as compared to a fixed-plate furnace.

Figure 2C:
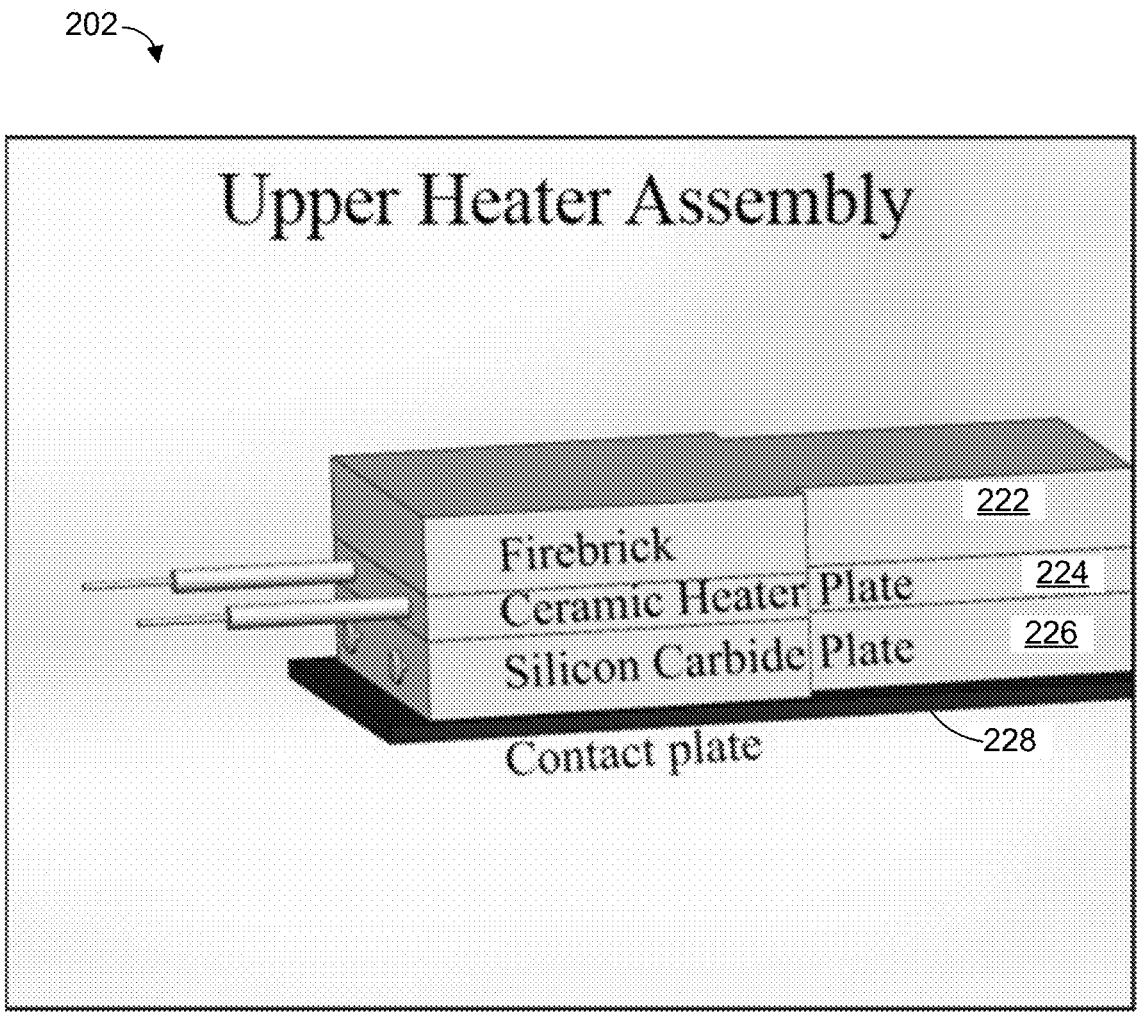
FIGS. 2C-2D show perspective views of example heating devices of the heating system of FIGS. 2A-2B.
Figure 2D:
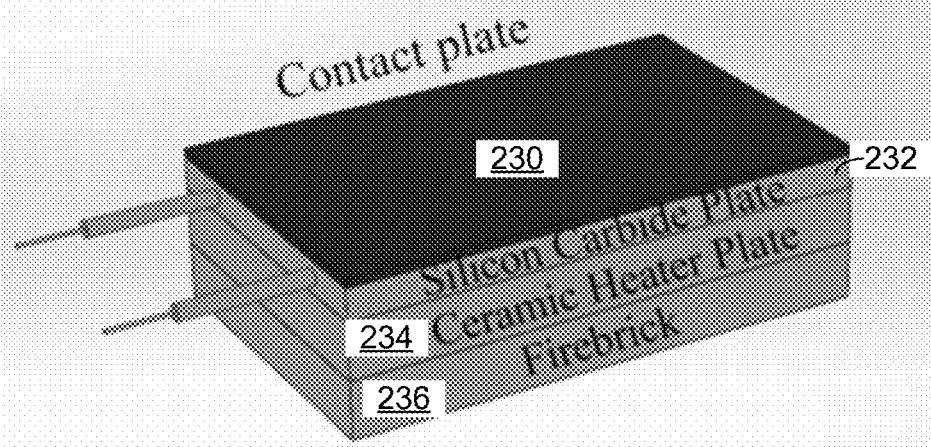

Turning to FIGS. 2C-2D, perspective views are shown of example heating assemblies of the heating system 200 of FIGS. 2A-2B. In FIG. 2C, the upper heater assembly 202 includes a contact plate 228 configured to touch the material 114 for conductive-based temperature annealing. The plate 228 is backed by a firebrick 222, a ceramic heater plate 224, and a silicon carbide plate 226. While these particular materials are used in this example assembly 202, other configurations are possible. In some implementations, the assembly 202 can be the heat source 106 (or a portion thereof) of FIGS. 1A-1B.

Similarly, In FIG. 2D, the lower heater assembly 204 includes a contact plate 230 configured to touch the material 114 for conductive-based temperature annealing. The plate 230 is backed by a firebrick 236, a ceramic heater plate 234, and a silicon carbide plate 232. While these particular materials are used in this example assembly 204, other configurations are possible. In some implementations, the assembly 202 can be the heat source 108 (or a portion thereof) of FIGS. 1A-1B.

By using the split-hinge retractable furnace, it is made possible to conserve the metallic ribbon until the furnace set point is achieved. Once at the desired temperature, the strain annealing process can be initiated by starting the operation of the rubber coated drive rollers to continuously de-spool the ribbon under controlled tension. The heating system 200 is first hinged open and then pulled in the direction of the ribbon to contact the fixed bottom plate assembly 204. The top plate heater assembly 202 is closed to "sandwich" the ribbon between the two heater assemblies. In some implementations, the gap between the plates 202, 204 is about three to four millimeters. After the desired amount of ribbon is strain annealed at the targeted conditions, the furnace can be opened and moved out of the direction of the ribbon.

For the split-hinge retractable furnace, there are at least several advantages over a fixed plate furnace including (1) improved processing times when different annealing conditions of time, temperature, and tension are investigated, (2) accelerated re-start after a ribbon breakage, (3) efficient use of limited metallic ribbon feedstock material, and (4) reduced thermal cycling of refractory components.

Figure 3A:
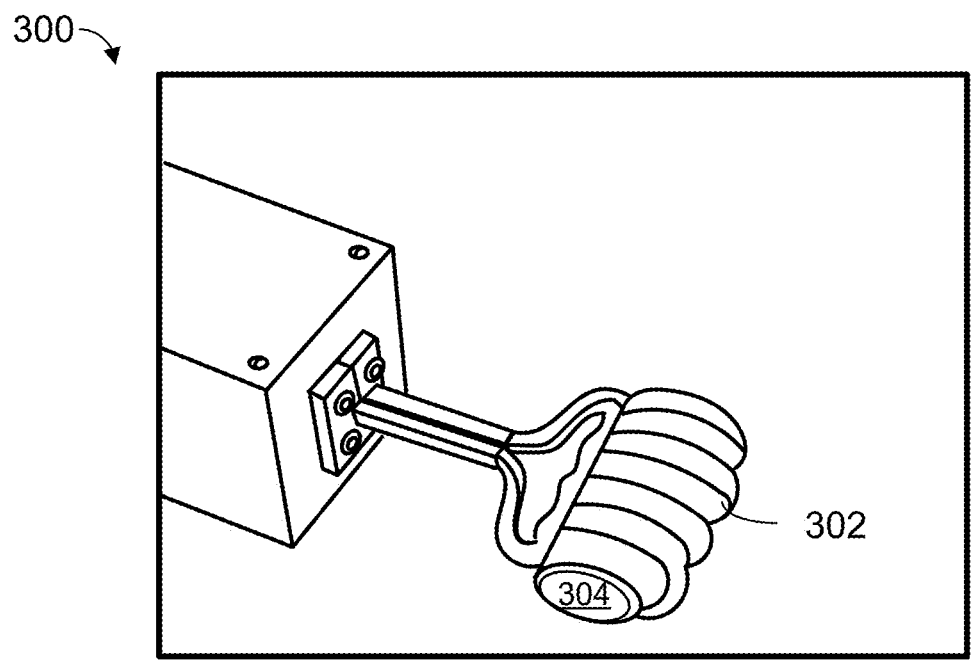
FIGS. 3A-3B show examples of susceptor heating devices for the heating system of FIGS. 2A-2D.

In addition to or alternatively to the heat plates described previously, one or both of the heat sources 106, 108 of the heating system 200 can include an inductively coupled susceptor. Turning to FIG. 3A, a heating source 300 includes an induction coil 302 with a susceptor 304 made of a material such as graphite, silicon carbide, or steel, can be added, although other materials can be considered. Generally, the susceptor 304 is inductively coupled to a magnetic field generated by the coil to produce heat. This approach is advantageous due to the difficulties directly coupling to the ribbon to ensure heating evenness along the ribbon's width. By using an inductively coupled susceptor 304 rather than ceramic heater plates (e.g., plates of heater assemblies 202, 204), the system 100 decreases a time required to achieve the temperature set point due to a greater heating response (e.g., greater rate of change of heat). With susceptor heating, induction is used to heat a metal conductive susceptor, which then heats a secondary material (e.g., the material 114) either through direct contact conduction or radiation. Susceptor heating is typically used when the material 114 to be heated is non-conductive, such as plastic, ceramic, and rubber, but is also used for heating very thin metals, such as amorphous metal ribbons. Susceptor heating can provide very precise heat and better heat control to a defined area in comparison to convection-based or even conduction-based annealing processes. Susceptors also provide better uniformity of heating of metal materials 114, versus direct induction heating which is limited by a skin depth.

Figure 3B:
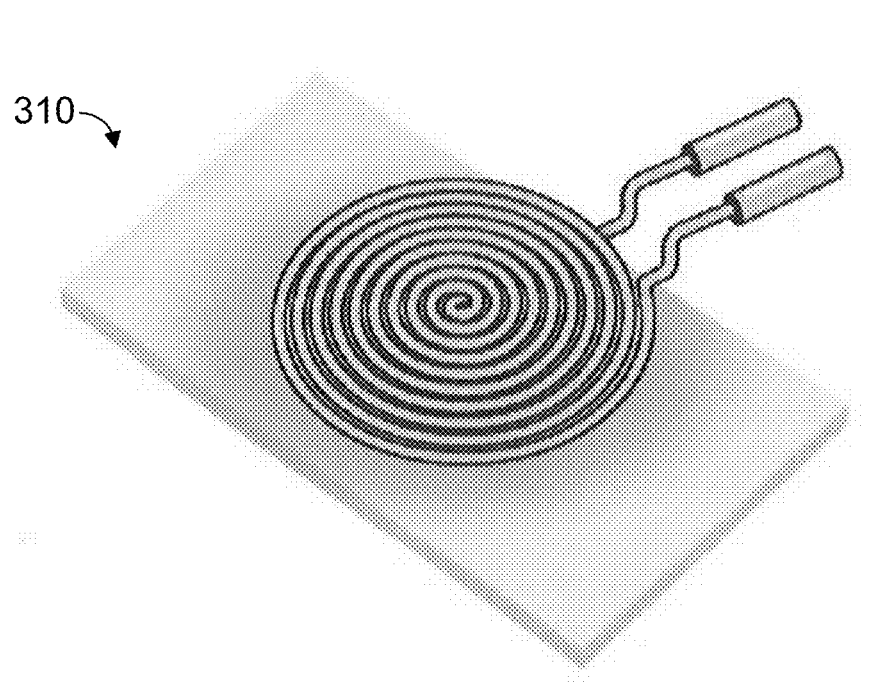

FIG. 3B depicts a pancake coil heating element 310. This element 310 is configured for planer coil heating. Such an element 310 can be used to create circular heated patterns on flat surfaces. In some implementations, such a heating element 310 can be used in combination with the assemblies 202, 204 of FIGS. 2A-2D.

Figure 3C:
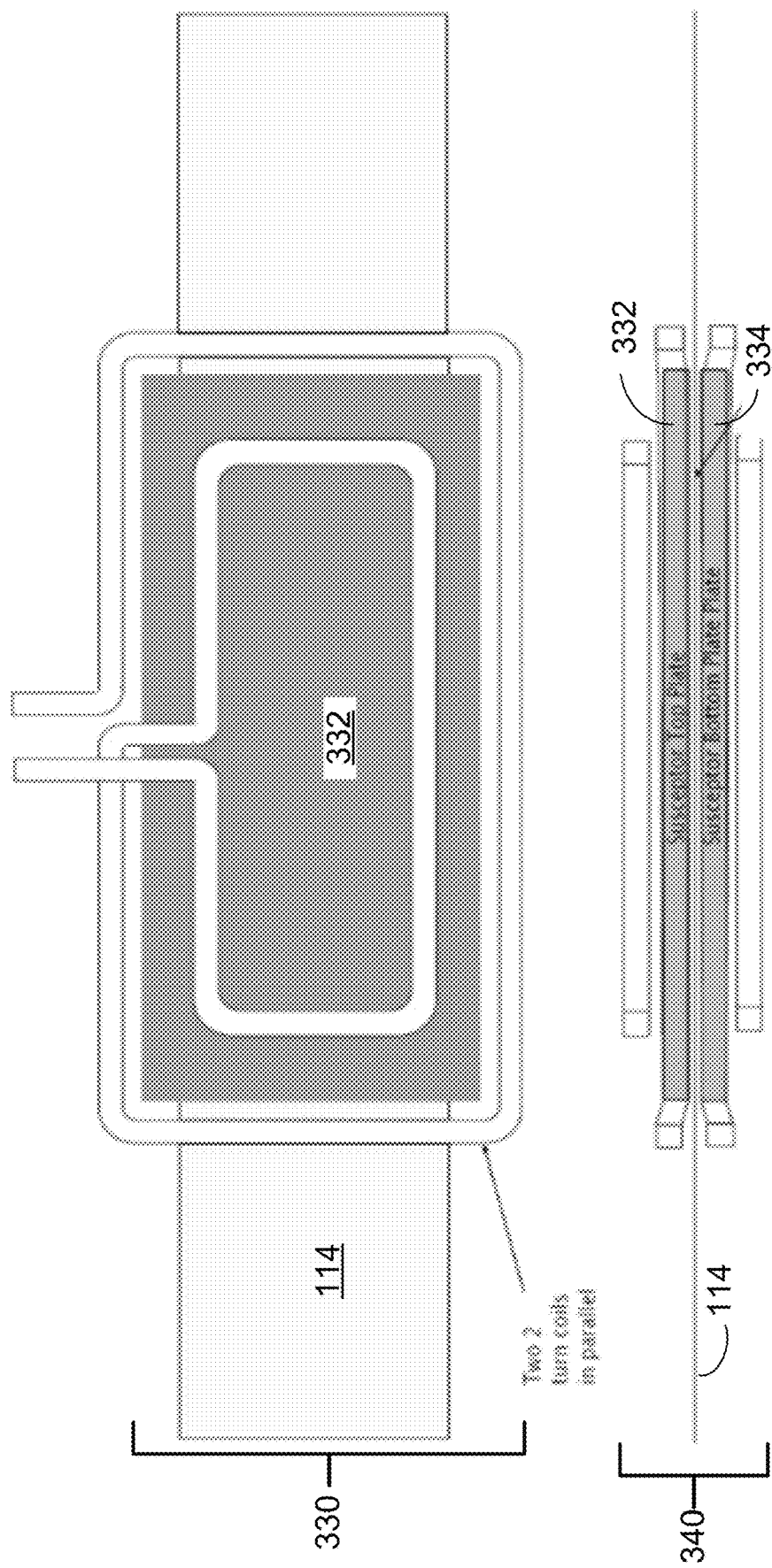
FIG. 3C shows a top view and a side view of an example heating system using induction heating devices.

Turning to FIG. 3C, the arrangement of the heat transfer plates 106, 108 of the system 100 remains the same when incorporating assembly 300, with the upper and lower plate assembly spaced to allow for ribbon insertion. Generally, the upper coil assembly features an open channel for in-line ribbon loading and a rail system for retracting from the ribbon motion path from the upper coil assembly, shown in top view 330. An example of a channel induction coil setup is shown with two turn coils 332 in parallel over material 114. This type of coil arrangement is used to heat the exterior of the material 114. An additional benefit of this coil design is the potential to have access to the open end of the coil. A side view 340 shows the ribbon 114 between two induction coil susceptor plates 332, and 334, which can operate in a similar manner as heating assemblies 202, 204, described in relation to FIGS. 2A-2D.

Figure 4A:
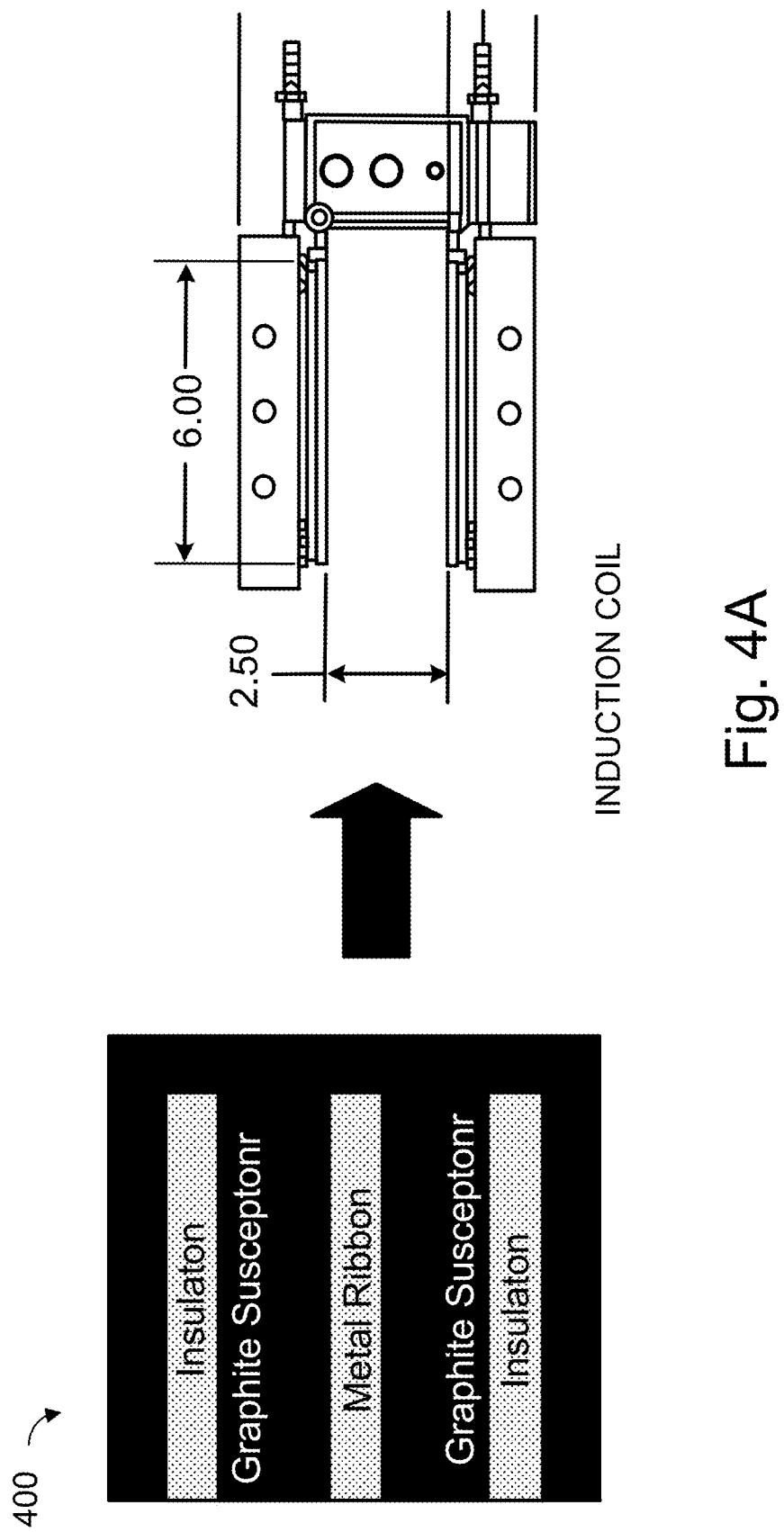
FIGS. 4A-4B show examples of heating devices configured for induction heating for a heating system for the thermal processing system of FIGS. 1A-1B.

FIG. 4A shows a cross-sectional schematic for a heating system 400 for the in-line induction annealing furnace (e.g., thermal processing system 100). The layers of the heating assembly include mirrored assemblies on each side of the ribbon. Each heat source of the heating system includes an induction coil, insulation, a graphite (or other such material) susceptor layer, and a metal layer (such as aluminum nitride) for contacting the ribbon. The ribbon is shown sandwiched between the heat sources in FIG. 4A. Schematic 410 shows example dimensions of the assembly 400.

Assembly 400 is more efficient for heat-up rates compared to ceramic heater plates. In some implementations, this can be the same arrangement of heat transfer plates as the ceramic heater plates, but uses the different heat source (e.g., induction). Advantages include that thermal cycling issues are eliminated. The assembly 400 can be used in conjunction with thermal imaging and thermometry for controlling gas streams and temperatures (in some cases, automatically). Generally, the susceptor plates have a relatively high thermal conductivity (e.g., similar to metals). Generally, the susceptor plates have high mechanical strength. Generally, the susceptor plates have low thermal expansion. The susceptor plates have high resistivity so that they are easier to heat through induction.

Generally, susceptors can include high resistivity/low conductivity (industrial grade) susceptors. In some implementations, the susceptors can include low resistivity/high conductivity (EDM copper impregnated graphite) graphite susceptors. For example, graphite susceptors with the properties shown in Table 1 are considered. However, any susceptor device can be included.

TABLE 1

Example Graphite Susceptors

| Graphite Grade | EDM-C3 | EDM-C200 | AXM-5Q | TM |
|---|---|---|---|---|
| Electrical resistivity (µOhm-in) | 127 | 114 | 650 | 480 |

The layered architecture of the furnace is such that the induction coil is the outmost component, with the innermost component being the amorphous metal ribbon. For each option, the induction annealing furnace features an open-ended construction to allow for in-line ribbon loading.

Figure 4B:
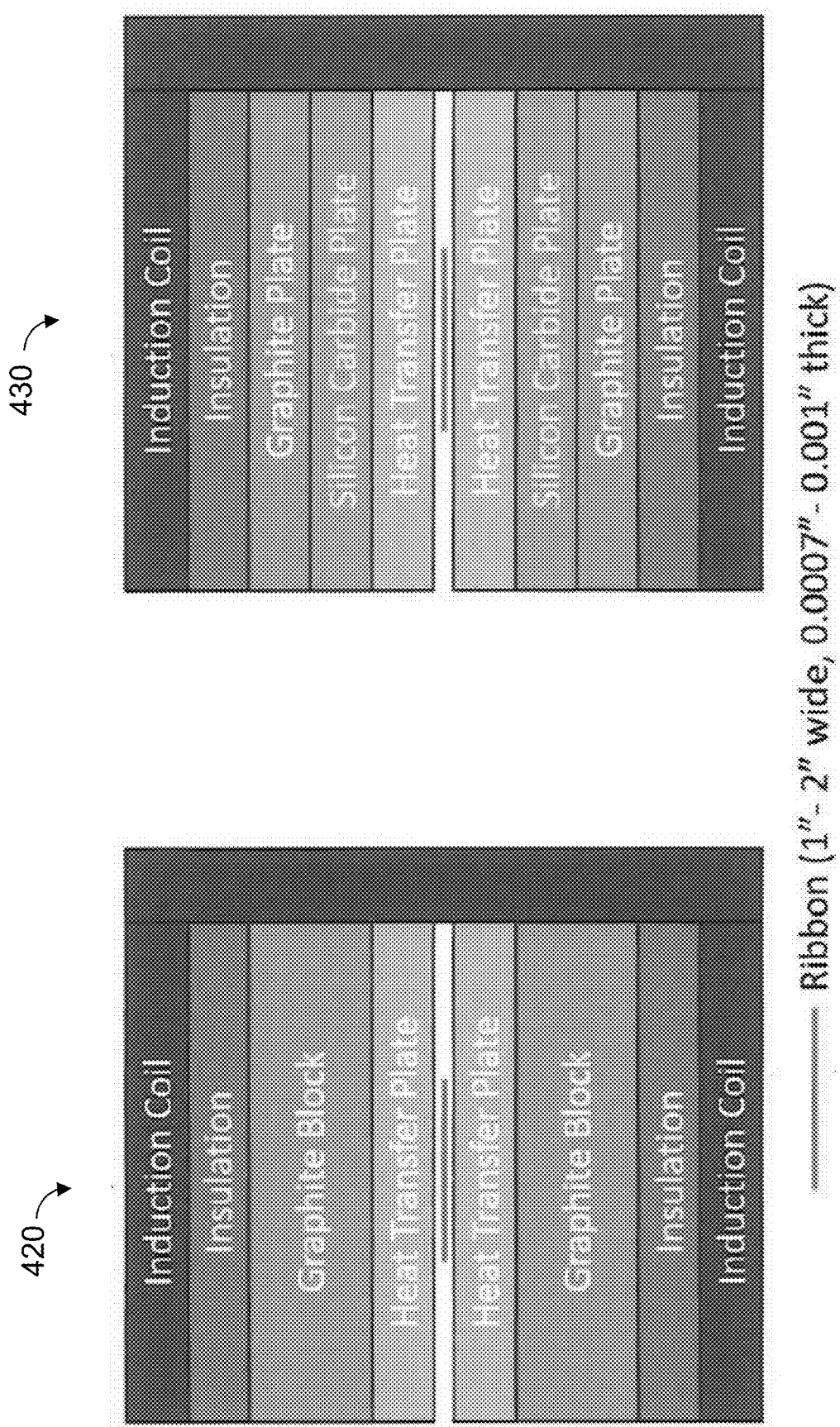

Turning to FIG. 4B, an alternative heating assembly stacks 420 and 430 for including in the heating system 200. Assembly 420 includes the coil, insulation, graphite block, and heat transfer plate for each heat source on either side of the material 114. Assembly 430 includes an induction coil, insulation, a graphite plate, a silicon carbide plate, and a heat transfer plate on either side of the material 114. In some implementations, components for 420 are detailed as follows (from top to bottom): the induction coil, fiberfrax insulation board (−0.5″), graphite block (−0.5″), heat transfer plate (−0.25″), the ribbon, heat transfer plate (−0.25″), graphite block (−0.5″), a fiberfrax insulation (−0.5″), and an induction coil. In some implementations, the components for assembly 430 are detailed as follows (from top to bottom): an induction coil, a fiberfrax insulation board (−0.5″), a graphite block (−0.5″), a heat transfer plate (−0.25″), the ribbon, a heat transfer plate (−0.25″), a graphite block (−0.5″), fiberfrax insulation (−0.5″), and an induction coil.

In addition to the application of thermal annealing using induction integrated with in-line strain annealing of amorphous metal ribbon, additional processing steps can also be included in addition or in substitution for the strain annealing. Examples include applied DC or AC magnetic fields, electric fields, and applied mechanical stresses. An important feature of the induction heating process is that heat is generated inside the material 114 itself, instead of by an external heat source via heat conduction. In the case of susceptor-based heating, heat may be generated within the susceptor and then transferred directly to the material 114 through direct thermal contact. Thus, materials 114 are heated very rapidly and efficiently. In the case of amorphous metal ribbons, induction heating is used for targeted heating to promote nano-crystallization during the in-line strain annealing process.

The induction heating process is understood to be generated by an engineered induction coil which does not require an enclosure. The induction coil (e.g., of FIGS. 3A-4B can operate in open air space and does not have to be confined by an enclosure to produce the desired electromagnetic energy. As such, the induction coil generates electromagnetic energy consisting of a spatially synchronized oscillation of electric and magnetic fields. The oscillations of the electric and magnetic fields are perpendicular to each other and perpendicular to the direction of energy and wave propagation. The induction coil operates outside the thermal susceptor material or heated thermal mass used to heat the ribbon, and so it operates at low temperature and has a long life. The energy transfer of induction heating is affected by the distance between the coil and the material, so the method described herein considers the energy losses that occur through heat conduction from the material to the fixture, natural convection, and thermal radiation.

The induction coils described in relation to FIGS. 3A-4B provide one or more of the following advantages. First, the induction coil heating assemblies provide rapid heating of amorphous ribbon over a significantly shorter length scale as compared to more traditional furnaces. Second, the induction coil heating assemblies provide more uniform heating over a significantly shorter length scale. Third, the induction coil heating assemblies provide more efficient heating to set-point due to greater heating response. Fourth, the induction coil heating assemblies provide an improved ability to focus the anneal zone over a smaller region of the ribbon to enable finer features for permeability engineering. Fifth, the induction coil heating assemblies provide an ability to control the thermal profile in terms of both heating and cooling rates in an in-line manufacturable process for amorphous magnetic core materials. Sixth, the induction coil heating assemblies provide integration of induction coils into an in-line process to optimize the process speed, the spatial resolution of the thermally treated region of the ribbon, and the unique properties/micro-structure of the ribbon. Seventh, the induction coil heating assemblies provide the ability to gain access to the ribbon while in the anneal zone including for temperature measurements through optical pyrometry, to apply DC or AC magnetic fields during the annealing process, for measurements of thickness, or other real-time processing or monitoring capabilities.

For both the direct (to the material), and indirect (where induction is used to heat a metal conductive susceptor, which then heats a material either through direct contact conduction or radiation) methods, coil frequency plays a role in the desired heating pattern. As such, the induction coil used in direct coupling can differ from the induction coil used in indirect coupling, in terms of not only frequency, but shape, number of coil turns, etc. However, in both embodiments, induction heating can produce high power densities which allow short and efficient interaction times to reach the required anneal temperature in the material. The induction coil is usually made of copper and fluid cooled where the diameter, shape, and number of turns influence the efficiency and magnetic field pattern. The induction coil transfers high-frequency electromagnetic energy from the induction system's output into the material. The coil must be designed to provide access to the heated zone or part. Many different coil types can be included in the thermal heating system 100, including a solenoid type, encircling type, channel type, internal type, planer type, C coil type, and so forth. The coil coupling well with the material increases performance of the coil. The coupling depends on overlapping of the coil turns with the heated area or material, as well as the distance between them. The better the coupling, the more efficient the coil is.

The arrangement of the induction coil or coils is an important consideration and will feature an open channel for in-line ribbon loading and, in many embodiments, a rail system for retracting from the ribbon motion path. As such, the induction annealing furnace architecture, in many preferred embodiments, is to use two induction coils, an upper and a lower coil. This will ensure the material is uniformly heated from both sides. Placement of the coil is a uniform distance away from the graphite susceptor to allow for 1) optimized coupling (i.e. uniform penetration of electromagnetic energy) and 2) adequate thermal insulation (for shielding high temperatures from sensitive coil). In addition, the separation between the top and bottom induction coils should be such that necessary heat transfer occurs to the material (i.e. amorphous metal ribbon).

One example of the induction coil geometry is specified as follows, with a width of 5", length range of 1"-9", and a spacing between coils can range from ~3.5" (for assembly 420) to ~4.5" (for assembly 430). However, other geometries are possible.

Strain annealing is a continuous and automated process used to provide heat treatment to metallic ribbons at the same time the ribbon is held under tension, with typical ribbon widths between 0.5 inches and 4 inches, thicknesses between 0.0007 inches and 0.001 inches. As the ribbon is passed through a thermal annealing zone (with typical anneal temperatures between 500° C. and 600° C., and typical anneal times from 3 to 10 seconds for a standard thermal annealing stage), a tension is applied along the ribbon axis. The anneal tension is maintained between the unwind spool and rubber coated drive rollers and the control of this tension as a function of length enables magnetic permeability tuning in a uniformly or spatially varying manner along the ribbon, as previously described in relation to FIG. 1A.

Where the susceptor is used as a heat source, by replacing the resistive ceramic heater plate with an induction coil and using it to heat a graphite susceptor, the heat from the susceptor is transmitted to a secondary material (e.g., the amorphous metal ribbon) either through direct contact conduction or radiation. By using induction to heat a susceptor (to then heat the material), the effective time to achieve the desired set point temperature is greatly reduced due to the greater heating response by using induction (as the heat source). The characteristic spatial dimension of the heated zone can also be reduced as well. This is in comparison to traditional in-line annealing heat sources (such as resistive ceramic heater plates) which are limited in the power, efficiency, shape, size, etc. which causes a larger contact area to be needed to ensure the material is heated uniformly than would be if using induction as the heat source.

In some implementations, heat transfer plates can be included in the heat source(s). As the innermost layer of the induction annealing furnace, the heat transfer plates must fit a variety of criteria, including excellent high temperature properties, high thermal conductivity, high mechanical strength, and low thermal expansion. In addition, the material used as the heat transfer plate is desired to be easily machined with traditional metal working tooling (such as end mills).

Figure 7:
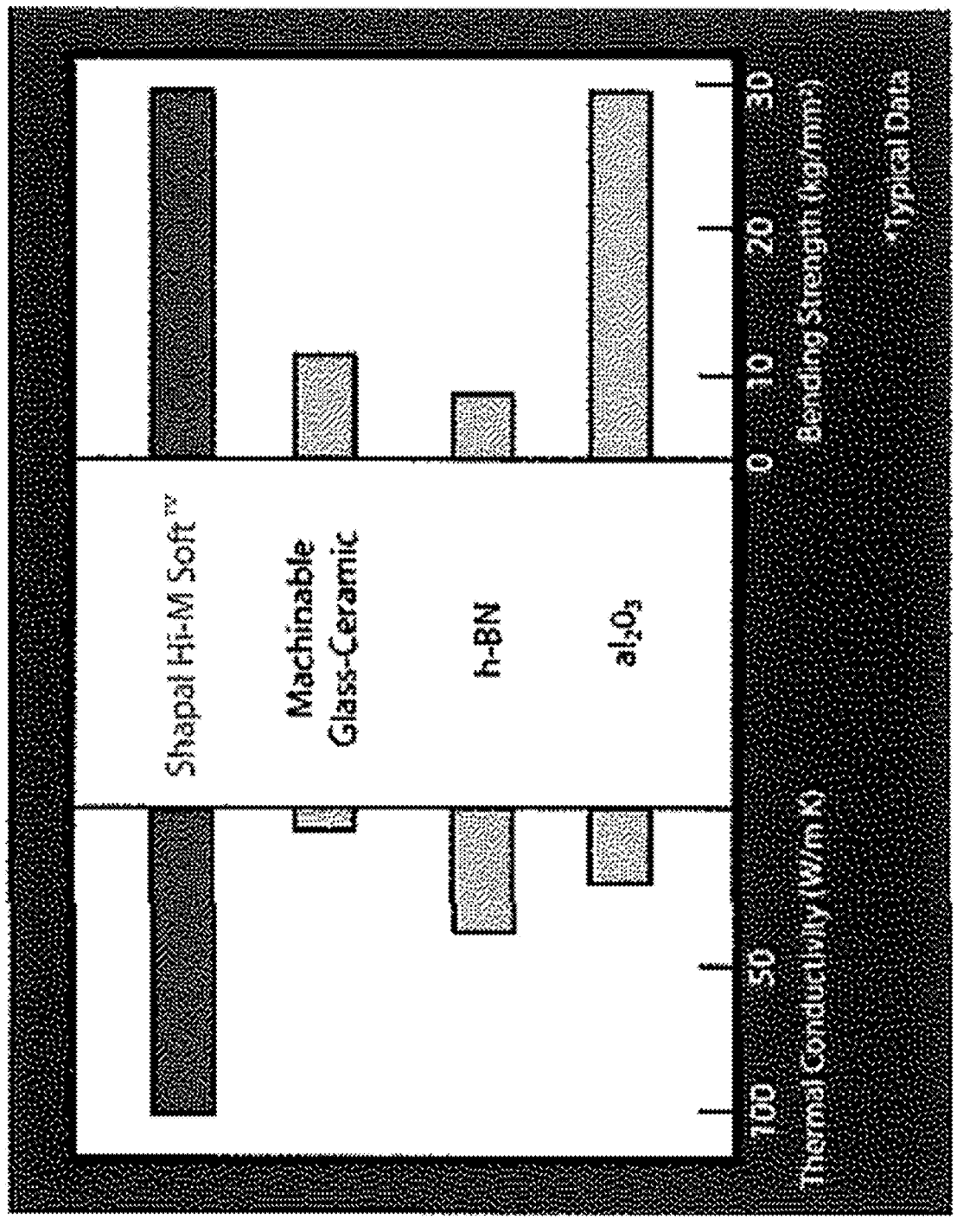
FIG. 7 shows a graph of example material properties for the heating devices of the processing system of FIGS. 1A-1B.

One exemplary preferred material fitting all of these criteria is SHAPAL Hi-M Soft, a sintered composite of aluminum nitride (Al-N) and boron nitride (B-N). Example properties for this material are show in graph 700 of FIG. 7. For this material, machined profiles are used to create a small space for the amorphous metal ribbon to travel through as to not impart any additional tension during the strain annealing process. Additional to the straight channel, this material is able to be machined into a variety of profiles, including plates with curvatures.

The addition of a layer of silicon carbide (SiC) to assembly 430 is used to further ensure the uniform transfer of heat to the material (i.e. amorphous metal ribbon). Furthermore, the SiC blocks may have an additional temperature measurement point by drilling out a cavity to allow a thermocouple to be placed inside (near the center).

For the susceptor-based induction heating method, an open line-of-sight can be used to directly measure temperature of the amorphous metal ribbon (via fiber optic infrared pyrometer). By enabling a direct ribbon surface temperature measurement, further control of the annealing temperature, and subsequent crystallization, can be achieved. In contrast, with the traditional in-line annealing furnace (i.e. resistive ceramic heater plate), temperature measurement is performed indirectly using a K-type thermocouple embedded into the heat transfer plate, thus relying on the overall material selection to most uniformly distribute the generated heat.

Having the ability to gain access to the ribbon while in the hot zone has advantages in terms of additional process parameters including applied magnetic fields, controlled gas streams, thermal imaging of the ribbon surface during the annealing process, and thermometry control using an IR pyrometer. There is an improved ability to focus the hot zone over a smaller region of the ribbon to enable finer features for permeability engineering. There is an additional heating component associated with the induction coil excitation of the ribbon which provides more rapid heating of the ribbon to enable faster processing times for multiple conditions and may also impact ribbon microstructure and properties.

The selection of high thermal conductivity heat transfer plates as the innermost layer of each heater assembly (e.g., assemblies 202, 204, 420, 430, and so forth). To ensure compatibility with the strain anneal process, heat transfer plates must fit a variety of criteria, including (1) excellent high temperature properties, (2) high thermal conductivity, (3) high mechanical strength, and (4) low thermal expansion. For example, a POCO GRAPHITE copper-impregnated-graphite sheet can be used as a material. The sheet can be cut to dimension in a band saw and sanded flat on either side. Although the copper-graphite exhibits high thermal conductivity and high mechanical strength, it is not easily machined. Due to this attribute, the use of a high-temperature standoff or counter-balanced upper heater assembly can be included to ensure an approximately even gap of 3-4 millimeters.

In another example, a ceramic composite material can be used. This material is distinguished from the copper-graphite by its unique characteristic to be easily machined with traditional tooling. The material, SHAPAL™ Hi-M SOFT, is a sintered composite of aluminum nitride (Al-N) and boron nitride (B-N). For the SHAPAL™ Hi-M SOFT ceramic plates, a slot is easily machined (milled) into the upper plate, effectively creating a small channel of 3-4 millimeters for the ribbon to pass through without the use of a standoff or counter-balancing. Additionally, curved (machined) profiles in the SHAPAL™ Hi-M SOFT ceramic plates can be generated to lessen the effect from crystallization buckling stresses which sometimes result in ribbon breakage during the strain anneal process for certain alloy systems (i.e., FINEMET Fe-based alloy systems) or can result in poor stacking factors of manufactured cores in cases where full breakage does not occur due to distortions of the flat ribbon geometry.

Further embodiments include the methods to measure processing temperature in each of the heating systems described previously. In both cases, measurement is performed using indirect methods due to the difficulties for direct ribbon thermometry. For the resistive wire ceramic plate heating method, a K-type thermocouple with rigid ceramic sheath is inserted into the center of each silicon carbide plate in the upper and lower heater assembly. By measuring the temperature in the (highly thermally conductive material) silicon carbide, the thermometry is uniform and accurate enough to ensure the ribbon is reaching the controller set point temperature. For the susceptor heating method, the open line of sight enables the use of an infrared (IR) pyrometer to measure a combination of susceptor temperature and ribbon surface temperature. In either case, control of annealing temperature is critical to the overall process for ribbon primary crystallization efforts.

Some advantages of the above systems and processes compared to existing approaches include an ability to conserve feedstock material (e.g., the amorphous and nanocomposite metallic ribbons). The advantages include an ability to pre-heat furnace independently of ribbon motion path. The advantages also include an ability to more efficiently strain anneal at multiple processing conditions (i.e. time, temperature, and tension parameters). The advantages include an ease of restarting after a ribbon breakage occur. For a ceramic heater furnace, the furnace will not have to be powered off, but rather just moved out of the way. For the induction furnace, there will be a fast heating/cooling to allow for a fast restart. The advantages include an ability to achieve smaller effective heated zones in a controlled manner to enable variations in properties along the ribbon with smaller characteristic length scales. The advantages include an ability to accelerate processing times through more efficient and more rapid ribbon heating. In addition, enhanced control of the thermal profile of the ribbon can allow for improved magnetic properties and an ability to adjust effective temperature and thermal profiles along the ribbon.

Figure 5:
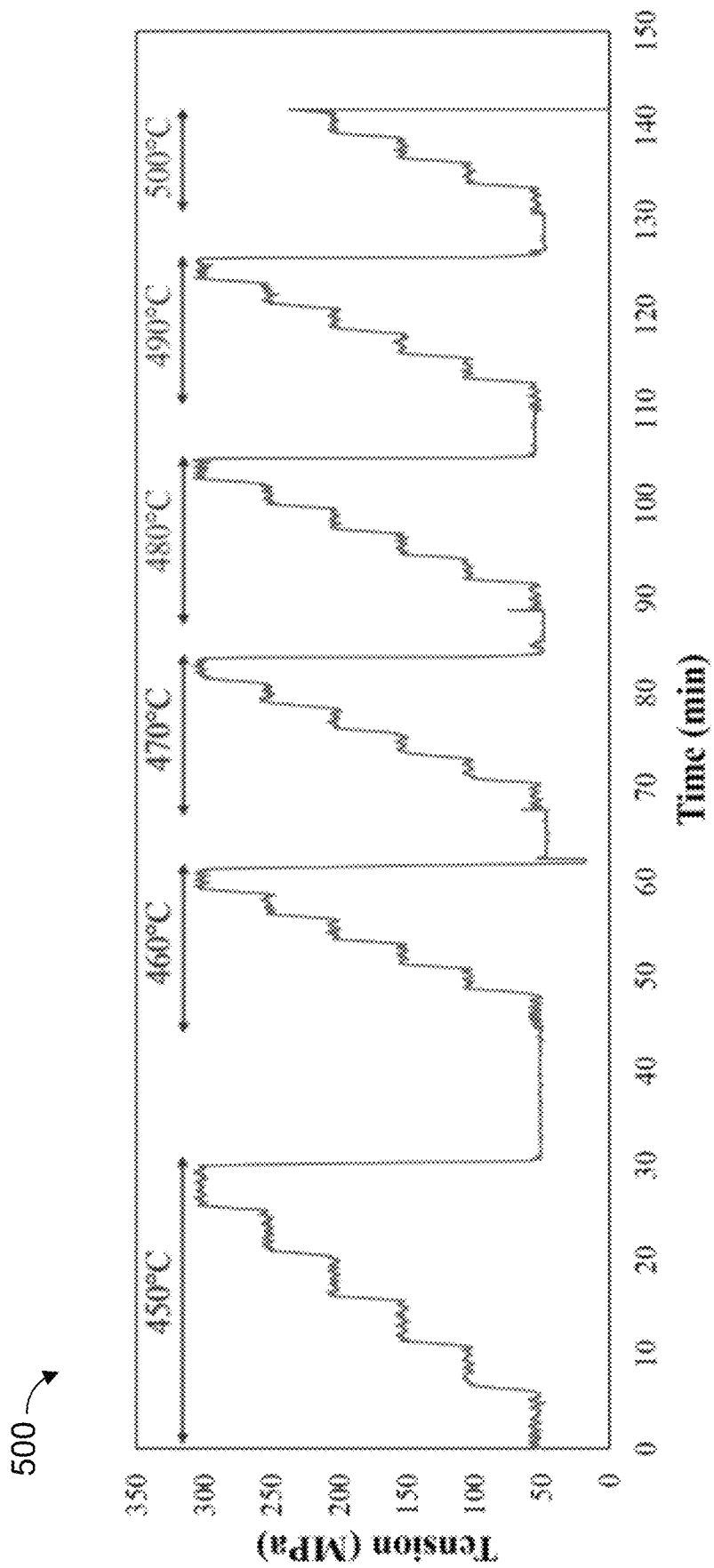
FIG. 5 shows an example strain anneal process that can be performed by the thermal processing system of FIGS. 1A-1B using the heating system without pausing the in-line thermal process.

FIG. 5 includes a graph 500 that shows how varying tensions and temperatures can be applied to the material over time without interrupting the in-line thermal processing. For example, the graph 500 shows a strain anneal using the split-hinge retractable furnace to explore ribbon crystallization effects over a range of anneal temperatures and tensions. Processing time for this type of experiment is greatly reduced (as compared to a fixed plate furnace) due to the ability of the split-hinge retractable furnace's set point temperature to be adjusted with the ribbon absent from the hot zone.

Figure 6:
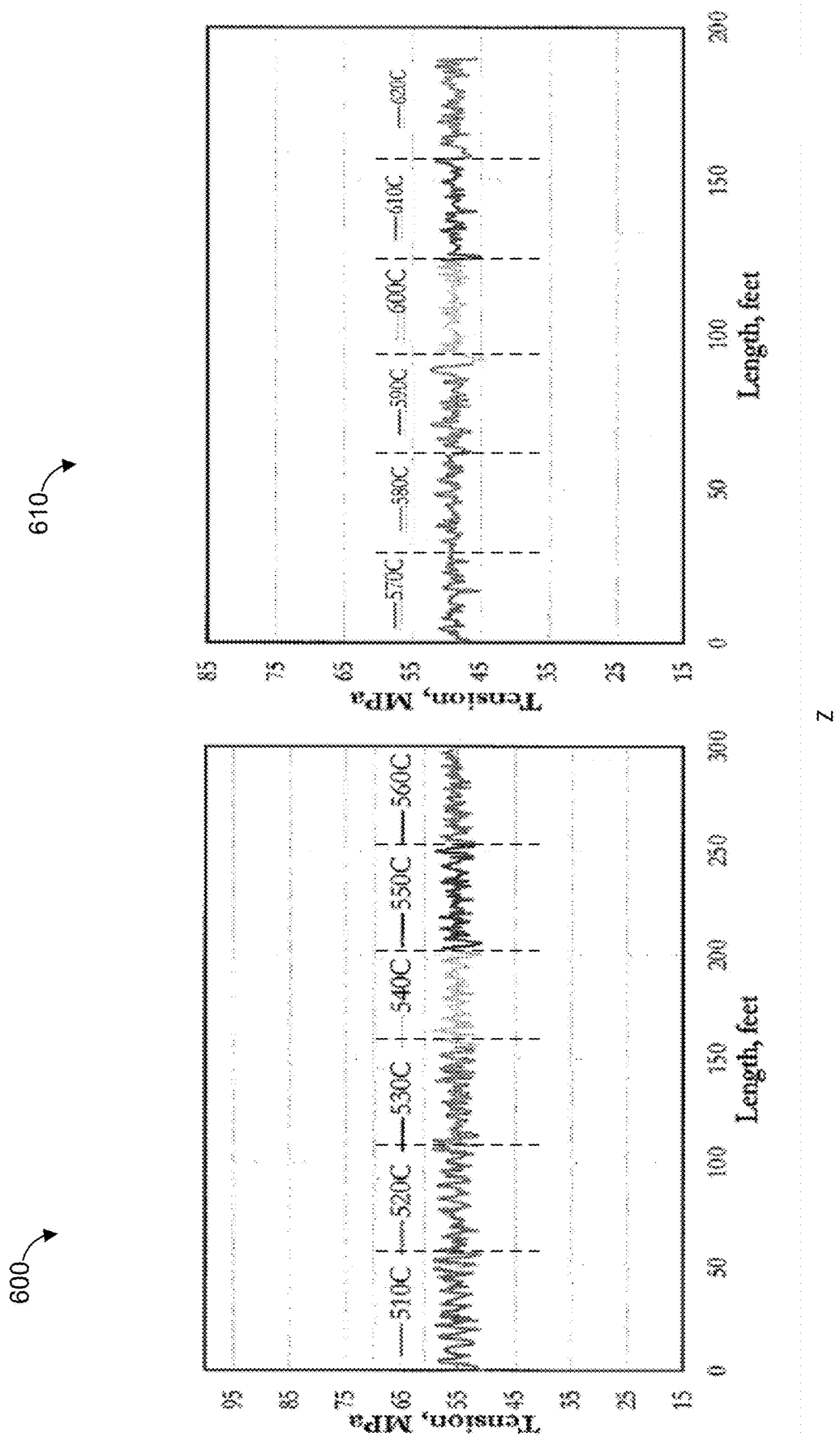
FIG. 6 shows example data showing changes in annealing temperature at a fixed tension value for an annealing process without pausing the in-line thermal process.

Similarly, FIG. 6 shows example graphs 600, 610 including data showing changes in annealing temperature at a fixed tension value for an annealing process without pausing the in-line thermal process.

In some aspects, the in-line annealing processes can be combined with controlled applied tensile strains. In some implementations, the multi-stage processing treatments can be integrated in-line to accomplish more complex processing strategies with at least one of the steps being comprised of a ceramic heater plate or inductively coupled susceptor. In some implementations, the same technique can be applied to other types of tape or sheet materials other than magnetic materials. In some implementations, other processes could be integrated in conjunction with these annealing steps including applied magnetic fields, controlled process gases, and the ability to gain direct access to the heated zone for imaging and other feedback to enable improved process controls.

The thermal processing systems described previously can be used in a wide range of processing techniques for amorphous or nanocomposite alloy ribbons for soft magnetic alloy applications including: 1) Inductors, 2) Current transformers, 3) Sensors, 4) Motors, 5) Transformers, 6) Electromagnetic Interference, 7) Electromagnetic Shielding, and so forth. The thermal processing system may also be utilized in processing of metallic tape or sheet materials for other applications such as brazings, structural materials, etc.

One example for applications of the ribbon generated by the thermal processing systems described previously includes an axial flux switched reluctance motor. The motor can include a rotor having alternating isotropic and anisotropic regions in the same material to create a multiple pole rotor with a built-in path flux.

Figure 8:
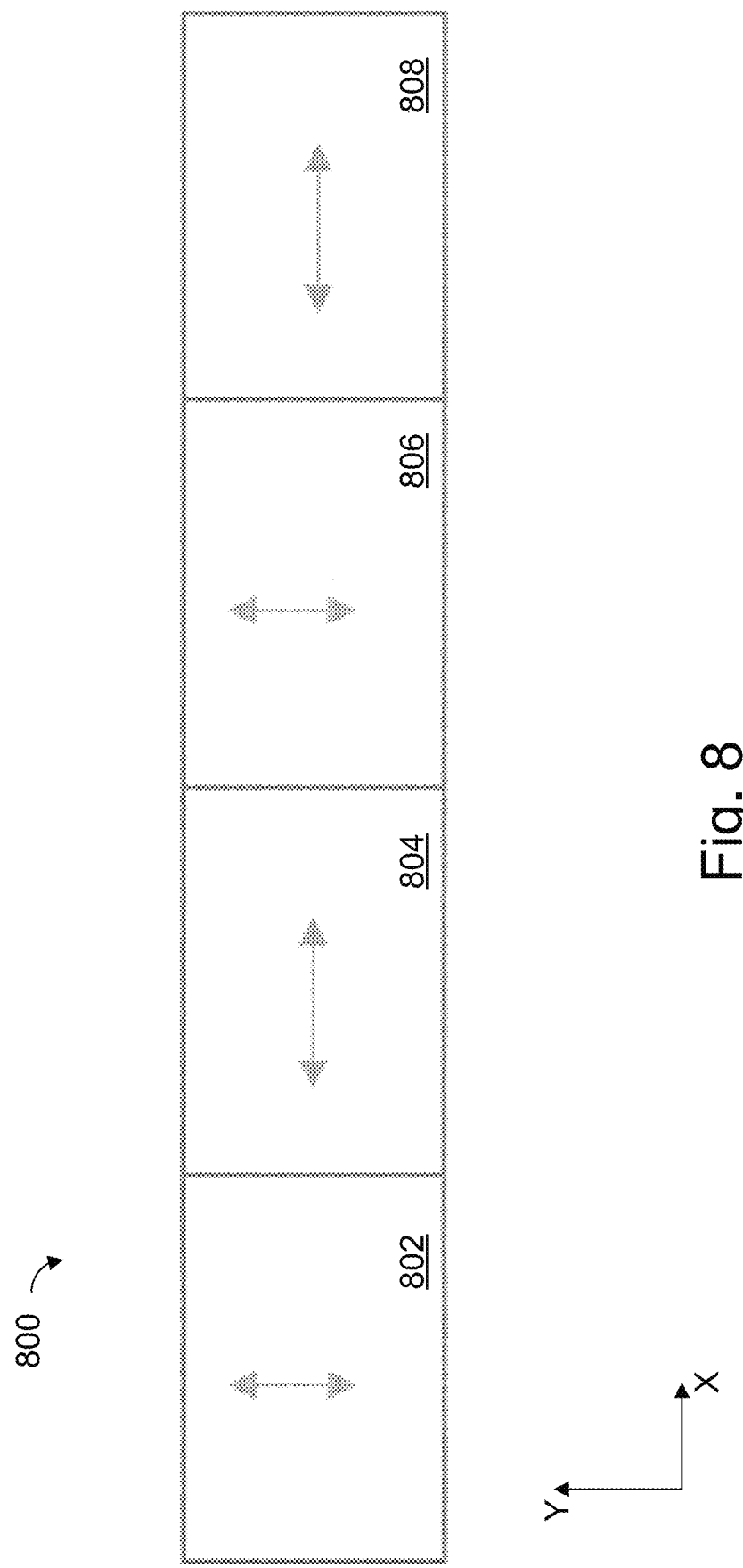
FIG. 8 shows an example of an anisotropy pattern in a material that is generated by a stress-annealing process of the processing system of FIGS. 1A-1B.

FIG. 8 shows an example rotor material 800 with alternating regions 802, 804, 806, 808 of isotropic and anisotropic properties. A certain amorphous magnetic material, which is often produced in a form of thin ribbon, may be processed into exhibiting highly anisotropic permeability with respect to the process orientation. It is possible to process the ribbon to possess a periodic pattern of anisotropy as shown in FIG. 8. This ribbon 800 may be coiled or otherwise stacked up to form a bulk solid mass that may be further machined as needed. The anisotropy pattern in permeability produced by a stress-annealing method. The arrows indicate the direction of high permeability. The permeability is much lower in the perpendicular direction. The regions 802, 804, 806, and 808 may have dimensions of approximately 0.5 inches to 4 inches in width (the Y dimension), as little as less than 1 inch long (the X dimension), and between 0.0007" and 0.001" thick.

Figure 10:
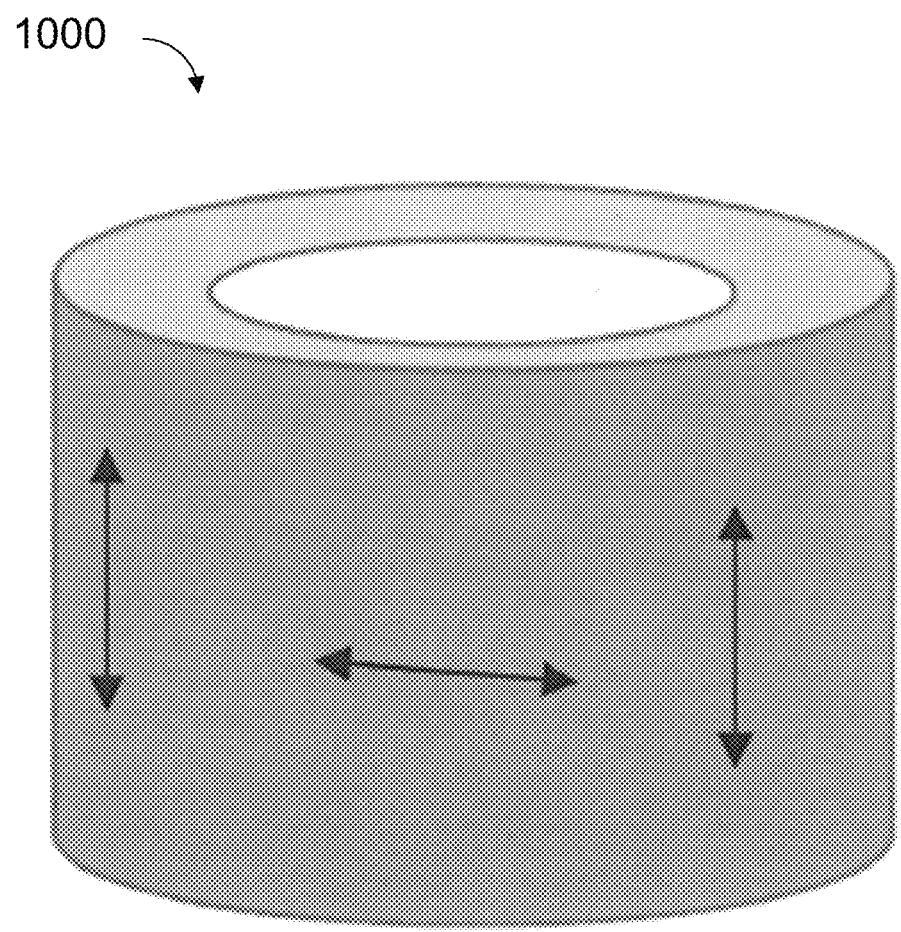
FIG. 10 shows an example of a rotor for an axial flux motor, the rotor including a patterned anisotropy in magnetic permeability.

This highly anisotropic permeability pattern may be used to construct an electromagnetic motion device 900, seen in FIGS. 9A-9B. In this example, the slider 800 is made from the soft magnetic materials with the permeability pattern of FIG. 8 and is placed in the air gap of an electromagnet 902. When this electromagnet 902 is turned on, it creates vertical magneto motive force (H-field) on the slider and tries to pull in the vertical anisotropy area, shown by arrow 904. By placing multiple electromagnets and controlling their activation, continuous motion can be achieved. This may be turned into an axial flux gap motor without changing the basic topology. A schematic design of the rotor 1000 is shown in FIG. 10. The rotor 1000 for an axial flux motor has a patterned anisotropy in permeability, shown by arrows on the rotor 1000.

Figure 11:
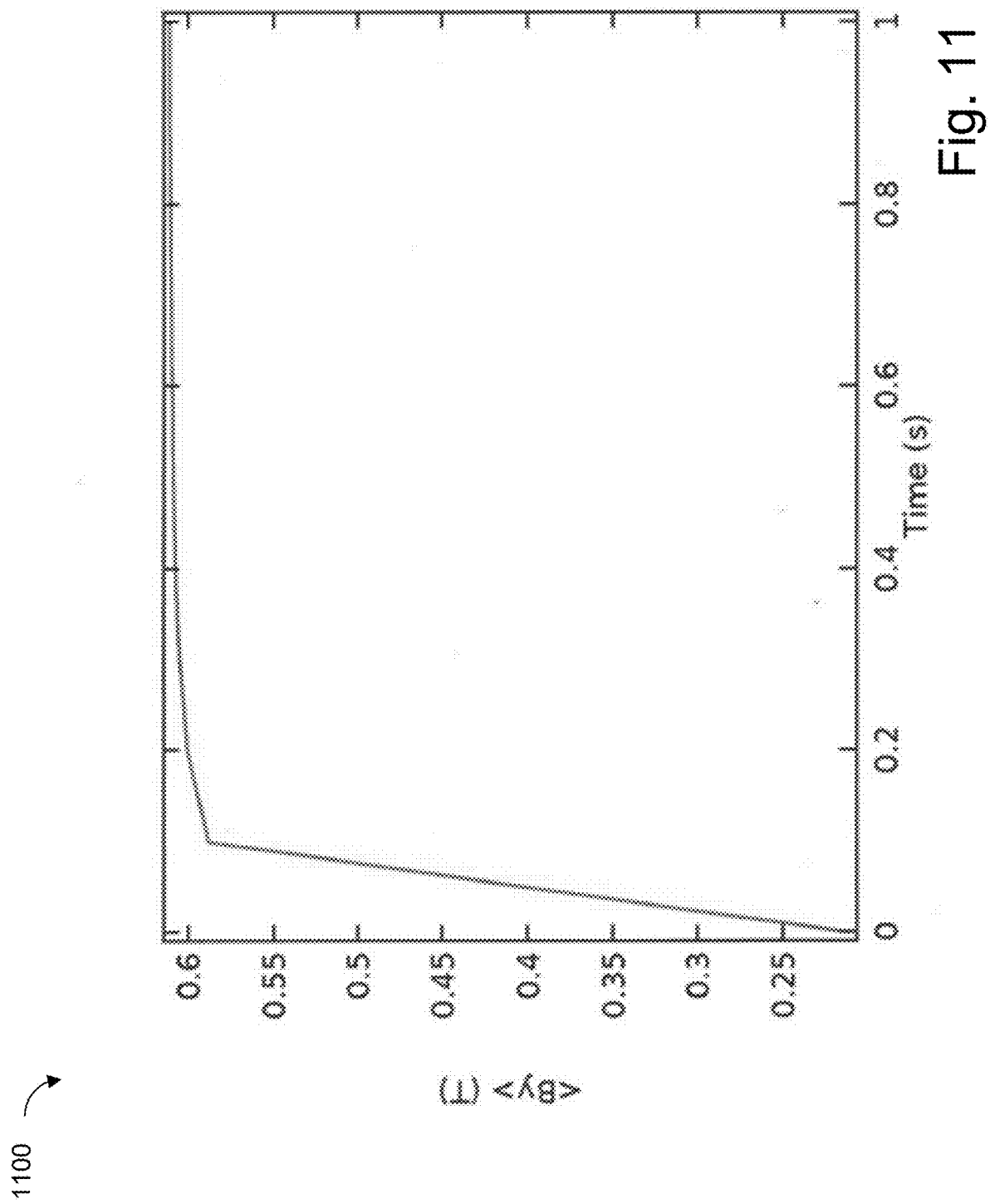
FIG. 11 shows a graph representing a change in flux density threading an electromagnetic (EM) coil for permeability values changing in time from 2-1000.

Turning to FIG. 11, a graph 1100 shows a change in flux density threading the electromagnet coil when the magnetic permeability is changed from 2 to 1000. The change is shown as a function of time because, for ease of simulation, the magnetic permeability to set to change linearly as a function of time. A two-dimensional finite element model was used to calculate the effect of permeability change. In this example, a soft magnetic material of 20 mm width and 5 mm height was placed into the air gap of an electromagnet with a 0.5 mm clearance on both sizes. The magnetic permeability µ was then changed from 2 to 1000 linearly to see the effect. The permeability in the perpendicular direction was set to change as 1000/µ. As shown in graph 1100, the flux density threading the coil shows a large change from 0.2 T to 0.6 T to this simulated change in the permeability due to the anisotropy. The most of the change occurs in the initial part of the change in magnetic permeability from 2 to ~100. More desirable profile may be realized by optimizing the design parameters and permeability pattern.

Figure 12:
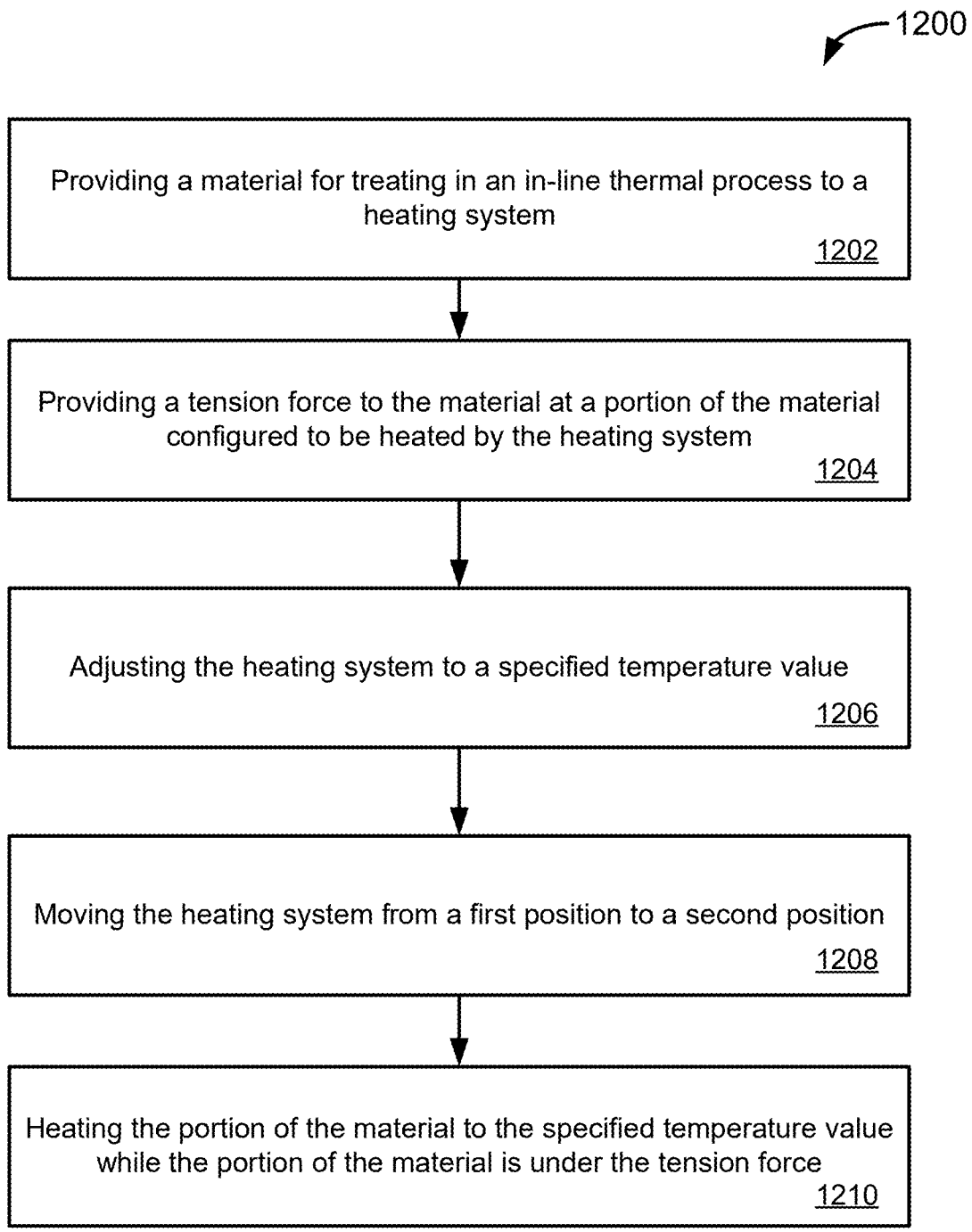
FIG. 12 is a flow diagram showing a process.

FIG. 12 is a flow diagram showing a process 1200 for thermally processing a material with a thermal processing system. The process 1200 includes providing (1202) a material for treating in an in-line thermal process to a heating system. The process 1200 includes providing (1204) a tension force to the material at a portion of the material configured to be heated by the heating system. The process 1200 includes adjusting (1206) the heating system to a specified temperature value. The process 1200 includes moving (1208) the heating system from a first position that is away from a path of the material through the in-line thermal process to a second position in which the heating system is configured to heat the portion of the material to the specified temperature value. The process 1200 includes heating (1210) the portion of the material to the specified temperature value while the portion of the material is under the tension force to change a magnetic property in the portion of the material.

Figure 13:
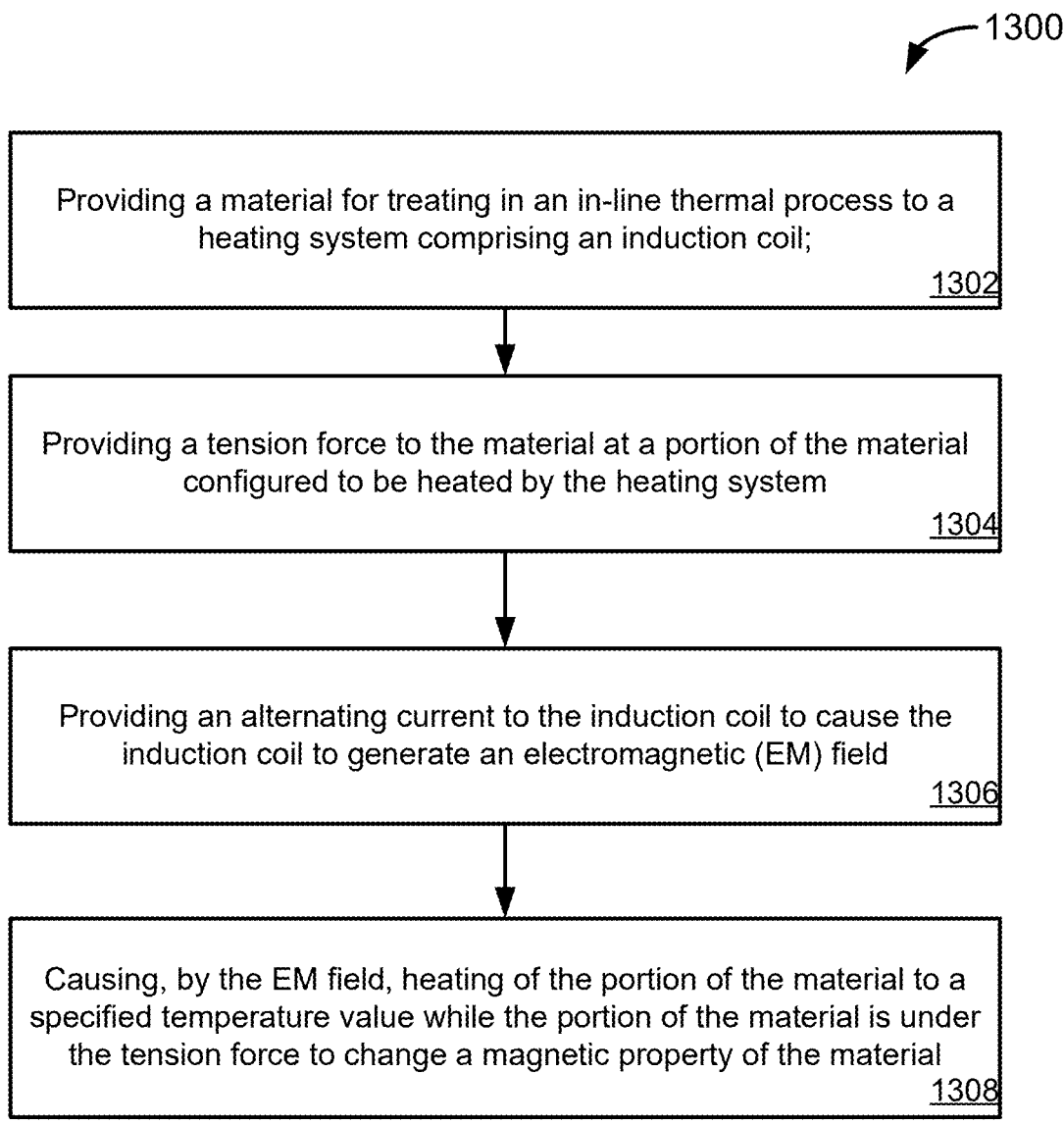
FIG. 13 is a flow diagram showing a process.

FIG. 13 is a flow diagram showing a process 1300 for thermally processing a material with a thermal processing system. The process 1300 includes providing (1302) a material for treating in an in-line thermal process to a heating system comprising an induction coil. The process 1300 includes providing (1304) a tension force to the material at a portion of the material configured to be heated by the heating system. The process 1300 includes providing (1306) an alternating current to the induction coil to cause the induction coil to generate an electromagnetic (EM) field. The process 1300 includes causing (1308) by the EM field, heating of the portion of the material to a specified temperature value while the portion of the material is under the tension force to change a magnetic property of the material.

Figure 14:
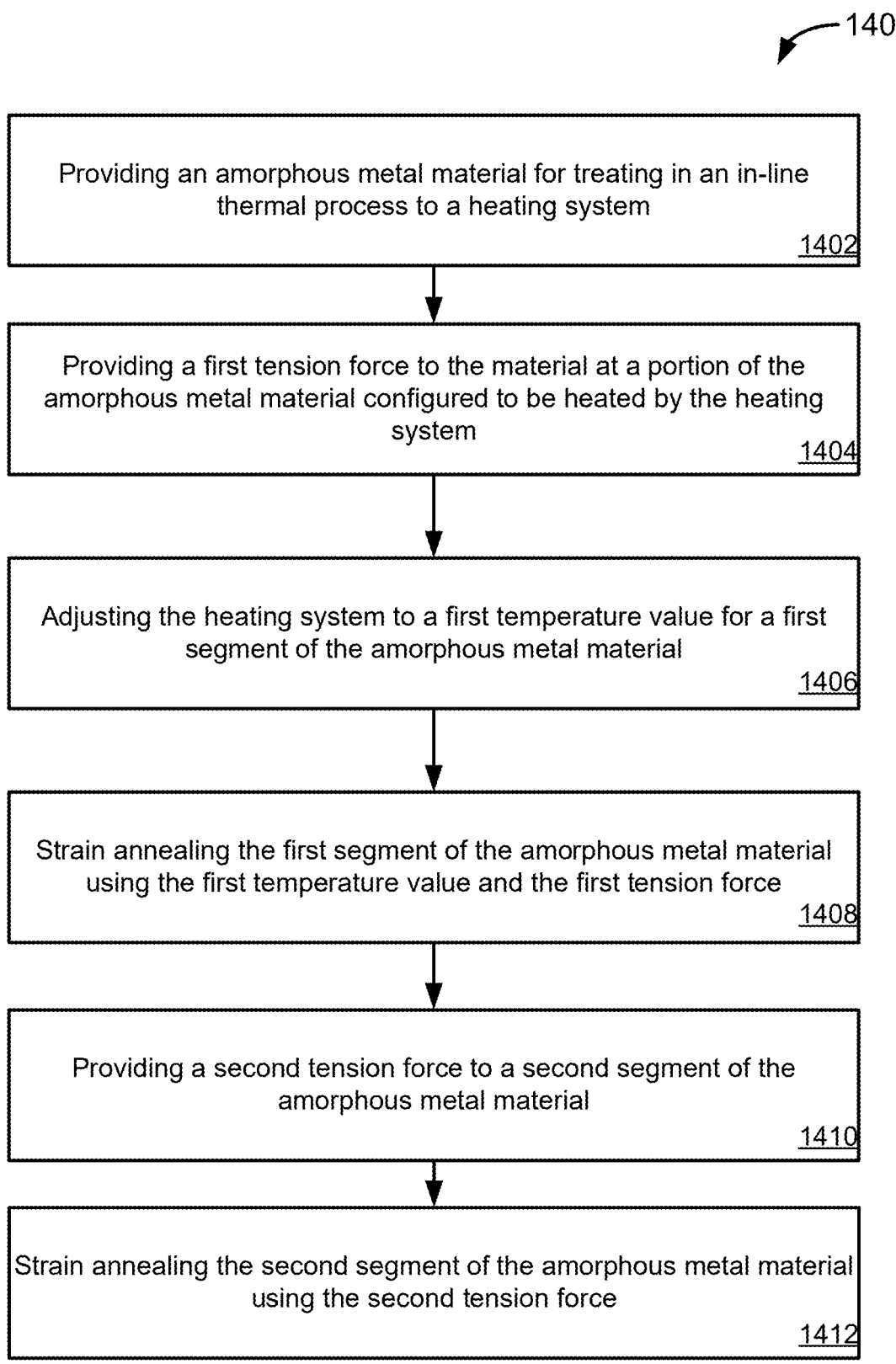
FIG. 14 is a flow diagram showing a process.

FIG. 14 is a flow diagram showing a process 1400 for thermally processing a material with a thermal processing system for forming a rotor of a linear motion device. The process 1400 includes providing (1402) an amorphous metal material for treating in an in-line thermal process to a heating system. The process 1400 includes providing (1404) a first tension force to the material at a portion of the amorphous metal material configured to be heated by the heating system. The process 1400 includes adjusting (1406) the heating system to a first temperature value for a first segment of the amorphous metal material. The process 1400 includes (1408) strain annealing the first segment of the amorphous metal material using the first temperature value and the first tension force. The process 1400 includes providing (1410) a second tension force to a second segment of the amorphous metal material. The process 1400 includes strain annealing (1412) the second segment of the amorphous metal material using the second tension force.

Other embodiments are within the scope and spirit of the description claims. Additionally, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

A number of exemplary implementations of the invention have been described. Nevertheless, it will be understood by one of ordinary skill in the art that various modifications may be made without departing from the spirit and scope of the invention.

What is claimed is:

1. A method of thermally processing a material with a thermal processing system, the method comprising:
   providing a material for treating in an in-line thermal process to heater comprising a first heating assembly that includes a first heating plate opposing a second heating assembly including a second heating plate, wherein the material is configured to move between the first heating plate and the second heating plate each configured to perform temperature annealing, and wherein the first heating plate and the second heating plate are wider than a width of the material for heating the material across the width, and wherein the first heating assembly and the second heating assembly are movable from a path of the material while enabling the material to maintain a tension of the material;
   providing a force to the material at a portion of the material configured to be heated by the first heating assembly and the second heating assembly of the heater, the force providing the tension to the material;
   adjusting the first heating assembly and the second heating assembly of the heater, to a specified temperature value;
   moving, while maintaining the tension to the material, the first heating plate of the first heating assembly or the second heating plate of the second heating assembly of the heater, at the specified temperature value, from a first position that is away from the path of the material through the in-line thermal process to a second position in which the portion of the material is between the first heating assembly and the second heating assembly of the heater, and wherein the heater is configured to approximately uniformly heat the portion of the material between the first heating assembly and the second heating assembly to the specified temperature value across the width of the material;
   wherein the material is configured to move between the first heating assembly and the second heating assembly to approximately uniformly heat the portion of the material to the specified temperature value across the width of the material while avoiding application of additional tension to the portion of the material;
   heating the portion of the material to the specified temperature value while the portion of the material is under the force to change a magnetic property in the portion of the material,
   wherein the portion of the material comprises a first segment of the material; and
   providing a different force value to a second segment of the material that is adjacent to the first segment to cause a different magnetic anisotropy in the second segment of the material.

2. The method of claim 1, wherein heating the portion of the material comprises:
   contacting a first side of the portion of the material with the first heating assembly; and contacting a second side of the portion of the material with the second heating assembly, the second side being opposite the first side.

3. The method of claim 2, wherein the heater comprises a hinge coupling the first heating assembly to the second heating assembly, and wherein moving the heater from the first position to the second position comprises moving the hinge from an open position to a closed position to cause the heater to close over the portion of the material, wherein the closed position causes the first heating assembly to contact or nearly contact the first side of the portion of the material and the second heating assembly to contact or nearly contact the second side of the portion of the material.

4. The method of claim 1, wherein moving the heater from the first position to the second position comprises moving the heater along a track that is approximately orthogonal to the in-line thermal process.

5. The method of claim 1, wherein providing the material comprises:
producing an amorphous precursor to the material, the material comprising a metal, to form an amorphous metal material having less than 20% crystallization by volume;
feeding the amorphous metal material into the heater;
performing, by the heater, devitrification of the amorphous precursor, wherein the devitrification comprises a process of crystallization;
forming, based on the devitrification, a nanocomposite with nano-crystals that comprises an induced magnetic anisotropy.

6. The method of claim 1, wherein the method further comprises
adjusting one or more of composition, temperature, speed, configuration, and magnitude of stress applied to the portion of the material; and
tuning a magnetic anisotropy of the material comprising an adjustment, based on the magnetic anisotropy, of a magnetic permeability of the material.

7. The method of claim 1, wherein heating the portion of the material to the specified temperature value comprises:
providing an induction coil in the heater; and
providing an alternating current to the induction coil to cause the induction coil to generate an electromagnetic (EM) field configured to cause the portion of the material to be at the specified temperature value.

8. The method of claim 1, wherein heating sources of the heater are shaped to correspond to a cross-sectional shape of the material.

9. A method of thermally processing a material with a thermal processing system, the method comprising:
providing a material for treating in an in-line thermal process to a heater comprising an induction coil, the heater configured for uniformly heating a width of the material by the in-line thermal process;
providing a force to the material at a portion of the material configured to be heated by the heater;
providing an alternating current to the induction coil to cause the induction coil to generate an electromagnetic (EM) field;
causing, by the EM field, heating of the portion of the material to a specified temperature value while the portion of the material is under the force to change a magnetic property of the material, wherein the heater comprises a susceptor device, the susceptor device enabling direct contact with the portion of the material while uniformly heating the portion of the material, and
wherein causing the heating of the portion of the material is based transmitting the heat through radiation; and
while the material is kept in tension in the in-line thermal process:
moving the heater away from the material;
advancing the material to cause a different portion of the material to be at the heater; and
readjusting the heater to a different temperature value;
returning the heater to the material for uniformly heating the width of the material by the in-line thermal process;
causing, by the EM field, heating of the different portion of the material to the different temperature value while the different portion of the material is under the force to change the magnetic property of the different portion of the material,
wherein the material is configured to move within the heater to approximately uniformly heat the portion of the material to the specified temperature value across the width of the material while avoiding application of additional tension to the portion of the material.

10. The method of claim 9, wherein causing, by the EM field, the heating of the portion of the material to the specified temperature value comprises:
contacting the susceptor device to the portion of the material; and
heating the susceptor device to the specified temperature value by the EM field, wherein the susceptor device is configured to heat the portion of the material to the specified temperature value by conduction.

11. The method of claim 9, wherein the heater comprises the induction coil, an insulating layer adjacent to the induction coil, a graphite block adjacent to the insulating layer, and a heat transfer plate adjacent to the graphite block, wherein the heat transfer plate is configured to contact the portion of the material.

12. The method of claim 9, wherein causing, by the EM field, heating of the portion of the material to the specified temperature value comprises:
causing the portion of the material to be heated by the EM field directly; and
causing the portion of the material to be heated by a susceptor device that is also heated by the EM field, the susceptor device being in thermal communication with the portion of the material.

13. The method of claim 9, wherein the material comprises an amorphous metal material, and wherein providing the amorphous metal material comprises:
producing an amorphous precursor to the material, the material comprising a metal, to form the amorphous metal material having less than 20% crystallization by volume;
feeding the amorphous metal material into the heater;
performing, by the heater, devitrification of the amorphous precursor, wherein the devitrification comprises a process of crystallization;
forming, based on the devitrification, a nanocomposite with nano-crystals that comprises an induced magnetic anisotropy.

14. A method for thermally processing a material with a thermal processing system, the method comprising:
providing an amorphous metal material for treating in an in-line thermal process to a heater comprising removable heat transfer plates;

providing a first force to the material at a portion of the amorphous metal material configured to be heated by the heater;

measuring a temperature of the portion of the amorphous metal material at the removable heat transfer plates;

adjusting, based on the measuring, the heater to a first temperature value at the removable heat transfer plates for applying to a first segment of the amorphous metal material;

strain annealing the first segment of the amorphous metal material using the first temperature value and the first force;

while the amorphous metal material is kept in tension in the in-line thermal process:
  removing the removable heat transfer plates from the amorphous metal material;
  advancing the amorphous metal material to cause a second segment of the amorphous metal material to be at the heater, the second segment being different than the first segment;
  returning the removable heat transfer plates to the amorphous metal material;
  providing a second force to the second segment of the amorphous metal material; and
  strain annealing the second segment of the amorphous metal material using the second force,
wherein the material is configured to move between the removable heat transfer plates to approximately uniformly heat the amorphous metal material to a specified temperature value across a width of the amorphous metal material while avoiding application of additional tension to the amorphous metal material.

15. The method of claim 14, further comprising adjusting the heater to a second temperature value different than the first temperature value for the second segment of the amorphous metal material; and
  strain annealing the second segment of the amorphous metal material using the second temperature value.

16. The method of claim 15, wherein the first temperature value is different than the second temperature value.

17. The method of claim 14, wherein the first force is different than the second force.

18. The method of claim 14, wherein strain annealing the amorphous metal material comprises conduction-based heating.

19. The method of claim 14, wherein strain annealing the amorphous metal material comprises induction-based heating.

\* \* \* \* \*